United States Patent
Liu

(10) Patent No.: US 11,259,430 B2
(45) Date of Patent: Feb. 22, 2022

(54) WATERPROOF PASSIVE WIRELESS CONTROLLER AND CONTROL SYSTEM AND APPLICATION THEREOF

(71) Applicant: Guangdong Ebelong Intelligent Technology Co., ltd., Shenzhen (CN)

(72) Inventor: YuanFang Liu, Shenzhen (CN)

(73) Assignee: Guangdong Ebelong Intelligent Technology Co., Ltd., Guangdong (CN)

( * ) Notice: Subject to any disclaimer, the term of this patent is extended or adjusted under 35 U.S.C. 154(b) by 79 days.

(21) Appl. No.: 16/478,123

(22) PCT Filed: Jan. 17, 2018

(86) PCT No.: PCT/CN2018/072929
§ 371 (c)(1),
(2) Date: Jul. 15, 2019

(87) PCT Pub. No.: WO2018/133788
PCT Pub. Date: Jul. 26, 2018

(65) Prior Publication Data
US 2020/0037459 A1    Jan. 30, 2020

(30) Foreign Application Priority Data

Jan. 19, 2017 (CN) .......................... 201710036941.4

(51) Int. Cl.
| H05K 5/06 | (2006.01) |
|---|---|
| F24D 19/10 | (2006.01) |
| G08C 17/02 | (2006.01) |
| H01H 9/04 | (2006.01) |
| H01H 13/06 | (2006.01) |

(Continued)

(52) U.S. Cl.
CPC ............. *H05K 5/069* (2013.01); *F24D 19/10* (2013.01); *G08C 17/02* (2013.01); *H01H 9/04* (2013.01); *H01H 13/06* (2013.01); *H02N 2/18* (2013.01); *H03K 17/94* (2013.01)

(58) Field of Classification Search
CPC ........ H05K 5/069; F24D 19/10; G08C 17/02; H01H 9/04; H01H 13/06; H02N 2/18
See application file for complete search history.

(56) References Cited

U.S. PATENT DOCUMENTS

| 2014/0043140 A1* | 2/2014 | Nakabayashi | ......... G08C 17/02 |
|---|---|---|---|
| | | | 340/5.72 |
| 2015/0054383 A1* | 2/2015 | Kang | ................... H03K 17/967 |
| | | | 310/319 |

FOREIGN PATENT DOCUMENTS

CN              104733202        *    6/2015      ............. H01H 13/06

* cited by examiner

*Primary Examiner* — James Wu
*Assistant Examiner* — Hung Q Dang
(74) *Attorney, Agent, or Firm* — Raymond Y. Chan; David and Raymond Patent Firm

(57) ABSTRACT

A waterproof passive wireless controller includes at least one waterproof assembly, at least one driver assembly, at least one power generator, at least one communication module, and at least one housing. The waterproof assembly and the housing form at least one waterproof chamber, wherein the power generator and the communication module are disposed in the waterproof chamber. In response to an external force applied on the driver assembly, the power generator is enclosed in a waterproof manner and is driven to actuate by the driver assembly to converts mechanical energy into electrical energy to power the communication module, such that the communication module is activated for sending out a control signal.

3 Claims, 19 Drawing Sheets

(51) Int. Cl.
*H02N 2/18* (2006.01)
*H03K 17/94* (2006.01)

WATERPROOF PASSIVE WIRELESS CONTROLLER AND CONTROL SYSTEM AND APPLICATION THEREOF

CROSS REFERENCE OF RELATED APPLICATION

This is a non-provisional application that claims priority to international application number PCT/CN2018/072929, international filing date Jan. 17, 2018, which claims priority to Chinese application number 201710036941.4, filing data Jan. 19, 2017, the entire contents of each of which are expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a controller, and more particularly to a waterproof passive wireless controller and a control system thereof, wherein the waterproof passive wireless controller is operated in a waterproof and wireless manner.

Description of Related Arts

There are two major types of existing passive wireless switch, wherein one type is a press-button type and another one is a pivot-button type. The press-button type of existing passive wireless switch comprises a single generator and a conductive rubber coupled at a PCB, wherein a command signal is generated when the conductive rubber is pressed to electrify the terminal of the PCB, such that an electrical level at a I/O port of the single generator is changed to generate the corresponding command code. However, via the electrical contact of the conductive rubber, such press-button type of passive wireless switch has several drawbacks. Firstly, the terminal of the PCB will be oxidized after a period of time, such that the oxidized terminal will result in poor conductive contact. Secondly, the aging conductive rubber will reduce the reliability of the actuation of the button. Thirdly, the contact between conductive rubber and the terminal is a mechanical contact that is not suitable for use in humid and high temperature environments, such that the application of the press-button type passive wireless switch is limited by environments.

The existing pivot-button type passive wireless switch comprises multiple generators to generate energy and to control command. However, the pivot-button type passive wireless switch can only generate a single command signal. In other words, a single command signal is generated by each actuation of the button, such that the pivot-button type passive wireless switch can only control a simple electrical apparatus, such as controlling the light apparatus in an on-and-off manner. Accordingly, there are various adjustments for an intelligent controlling system. For example, for adjusting the brightness of the light bulb, the button is actuated twice, i.e. from the first position to the second position and back to the first position, in order to generate two consecutive command signals. As a result, the two consecutive command signals are combined to form a combined signal for adjustment control. It is worth mentioning that the actuating and releasing actions of the pivot-button type passive wireless switch cannot generate the two consecutive command signals, such that the application of the pivot-button type passive wireless switch is limited.

Furthermore, in order to provide a waterproof feature for the existing passive wireless switch, a waterproof coating is applied on the circuit board and its wiring system according to the existing electronic waterproof technology. However, the processing of applying the waterproof coating is complicated and the manufacturing cost thereof is relatively expensive. Thus, it is difficult to repair when there is a water leakage of the switch. It is worth mentioning that the circuit board and its wiring system are coated with the waterproof coating at the same time to form an integrated member. In other words, via the waterproof coating, the existing passive wireless switch cannot be modularized that when one component thereof is damaged, the entire switch must be replaced. Therefore, the problem of the existing passive wireless switch with the waterproof feature cannot be solved and the application thereof is limited.

SUMMARY OF THE PRESENT INVENTION

The invention is advantageous in that it provides a waterproof passive wireless controller and a control system thereof, wherein the waterproof passive wireless controller is operated in a waterproof and wireless manner.

Another advantage of the invention is to provide a waterproof passive wireless controller and a control system thereof, which can improve the reliability and service life span of the waterproof passive wireless controller.

Another advantage of the invention is to provide a waterproof passive wireless controller and a control system thereof, which provides a disassembling structure to enable the waterproof passive wireless controller as a replacement component being used in different applications.

Another advantage of the invention is to provide a waterproof passive wireless controller and a control system thereof, which is able to generate different control commands by electric pulse.

Another advantage of the invention is to provide a waterproof passive wireless controller and a control system thereof, which comprises at least one power generator, wherein the power generators are independently operated without interfering with each other, so as to improve the service life span thereof.

Another advantage of the invention is to provide a waterproof passive wireless controller and a control system thereof, wherein the power generator not only generates the electrical energy for powering itself but also generates a command signal, so as to improve the reliability of the control signal through the signal transmitting circuit.

Another advantage of the invention is to provide a waterproof passive wireless controller and a control system thereof, which comprises at least one waterproof assembly and at least one housing, wherein the waterproof assembly and the housing form at least a waterproof chamber in a sealed and enclosed manner, such that the power generator and at least one communication module are disposed in the waterproof chamber to enhance the waterproof ability.

Another advantage of the invention is to provide a waterproof passive wireless controller and a control system thereof, wherein the waterproof assembly further comprises at least one waterproof cover and at least one waterproof wall. The waterproof wall is extended from the waterproof cover and is tightly extended in a waterproof groove at a bottom cover of the housing.

Another advantage of the invention is to provide a waterproof passive wireless controller and a control system thereof, wherein the waterproof assembly further comprises at least one outer edge outwardly extended from the waterproof wall and the waterproof cover to further improve the waterproof ability.

Another advantage of the invention is to provide a waterproof passive wireless controller and a control system thereof, which comprises a driver assembly comprising a driver assembly pressing arm. The waterproof assembly has a driver assembly arm slot provided on the waterproof cover, wherein the driver assembly pressing arm is engaged with the driver assembly arm slot for improving stability of the passive wireless controller during the operation.

Another advantage of the invention is to provide a waterproof passive wireless controller and a control system thereof, which comprises at least one elastic accelerating element for accelerating the movement of the power generator.

Another advantage of the invention is to provide a waterproof passive wireless controller and a control system thereof, which comprises at least a resetting member to reset the driver assembly and the power generator back to their original positions after every operation.

Another advantage of the invention is to provide a waterproof passive wireless controller and a control system thereof, which comprises at least one resetting module for enabling the wireless control switch to generate a combined control command.

Another advantage of the invention is to provide a waterproof passive wireless controller and a control system thereof, wherein the driver assembly comprises a plurality of actuation buttons for implementing multi-button operation.

Another advantage of the invention is to provide a waterproof passive wireless controller and a control system thereof, which is able to apply to a smart home and to have excellent waterproof ability.

Additional advantages and features of the invention will become apparent from the description which follows, and may be realized by means of the instrumentalities and combinations particular point out in the appended claims.

According to the present invention, the foregoing and other objects and advantages are attained by a waterproof passive wireless controller which comprises at least a waterproof assembly, at least a driver assembly, at least a power generator, at least a communication module, and at least a housing. The waterproof assembly and the housing form at least a waterproof chamber in a sealed and enclosed manner, wherein the power generator and the communication module are supported in the waterproof chamber. In response to an external force, the driver assembly is driven to move to actuate the power generator which is separated by the waterproof assembly. Each of the power generators is electrically connected to the communication module and is arranged to convert mechanical energy into electrical energy to electrically power the communication module, such that the communication module is arranged to generate a control command in a radio signal.

In one embodiment, the housing comprises at least a top cover and at least a bottom cover, wherein the edge of the waterproof assembly is pressed against the edge of the bottom cover via the top cover, such that the waterproof chamber is formed between the waterproof assembly and the bottom cover. The driver assembly is supported on the top cover.

In one embodiment, the driver assembly serves as a top cover of the housing, wherein the housing further comprises at least a bottom cover, wherein the edge of the waterproof assembly is pressed against the edge of the bottom cover via the driver assembly to form a waterproof chamber between the waterproof assembly and the bottom cover.

In one embodiment, the waterproof assembly further comprises at least one waterproof cover and at least one waterproof wall, wherein the waterproof wall is extended from the waterproof cover and is tightly extended in a waterproof groove at a bottom cover of the housing.

In one embodiment, the waterproof wall is integrally formed with the waterproof cover.

In one embodiment, the bottom cover further comprises a waterproof groove forming member which comprises an outer surrounding wall upwardly extended from the bottom cover and an inner surrounding wall spaced apart from the outer surrounding wall, wherein the waterproof groove is formed between the outer surrounding wall and the inner surrounding wall.

In one embodiment, the waterproof groove is indented on the bottom cover.

In one embodiment, the waterproof assembly further has an outer edge outwardly extended from the waterproof wall and the waterproof cover.

In one embodiment, the housing further comprises a top cover coupled to the bottom cover via a cover snap assembly, wherein the driver assembly is supported on the top cover.

In one embodiment, the top cover has a top cover main portion constructed as an annular frame and a top cover rim, wherein the top cover rim is annularly formed at an inner surrounding edge of the top cover main portion, wherein the outer peripheral edge of the waterproof cover of the waterproof assembly is extended out of the waterproof chamber.

In one embodiment, the driver assembly further comprises a driver assembly fastener locking at the housing to prevent the driver assembly being detached therefrom.

In one embodiment, the housing comprises a supporting shaft formed as a pivot axle of the driver assembly to enable the pivotal movement of the driver assembly.

In one embodiment, the driver assembly further comprises a shaft fastener provided at an inner side thereof to fasten with the supporting shaft.

In one embodiment, the driver assembly further comprises at least a driver assembly pressing arm, wherein the waterproof assembly has a driver assembly arm slot provided at the waterproof cover that the driver assembly pressing arm is engaged with the driver assembly arm slot.

In one embodiment, the waterproof passive wireless controller further comprises at least a resetting member and at least one elastic accelerating member, wherein the resetting member and the elastic accelerating member are supported in the waterproof chamber. The driver assembly is separated by the waterproof assembly in a waterproof manner and is actuated by the elastic accelerating member. The elastic accelerating member is coupled to the power generator to accelerate the movement of the power generator. The resetting member is arranged to reset the driver assembly, the power generator and the elastic accelerating member back to their original positions.

In one embodiment, the waterproof assembly further comprises an elastic accelerating pressing member provided on a side of the waterproof cover corresponding to the waterproof chamber, wherein the elastic accelerating member is pressed by the elastic accelerating pressing member, such that the elastic accelerating member is driven to actuate the power generator.

In one embodiment, the elastic accelerating pressing member is integrally protruded from an inner surface of the waterproof cover.

In one embodiment, the power generator comprises at least a magnetic element set, and at least a coil assembly and at least a center shaft. The coil assembly is encircled around the center shaft. The magnetic element set comprises a permanent magnet member, a top magnetic conductive cover, a bottom magnetic conductive cover, wherein the top magnetic conductive cover and the bottom magnetic conductive cover are located at two opposite sides of the permanent magnet member respectively. The elastic accelerating member is coupled to the center shaft to drive the center shaft to alternately contact with the top magnetic conductive cover and the bottom magnetic conductive cover in a synchronization manner for generating a direction change of the magnetic line to generate the induced current through the coil assembly.

In one embodiment, the housing further has a communication module slot and a power generator coupling slot, wherein the communication module is disposed in the communication module slot and the power generator is disposed in the power generator coupling slot.

In one embodiment, the housing further comprises a power generator mounting member which has a plurality of power generator mounting side panels and a power generator mounting groove formed between every two adjacent power generator mounting side panels, wherein the power generators are coupled at the power generator mounting grooves respectively.

In one embodiment, the power generators are coupled at the power generator mounting grooves respectively via snap-fitted connection.

In one embodiment, at least a resetting member coupling shaft is coupled at an outer side of each of the power generator mounting side panels, wherein two ends of the resetting member are coupled at the resetting member coupling shaft. A portion of the resetting member is disposed between two reset element mounting shafts to abut the elastic accelerating member.

In one embodiment, the resetting member is embodied as at least a reset torsion spring, and the elastic accelerating member is embodied as at least a spring piece.

In one embodiment, the driver assembly is embodied as a plurality of buttons being detachably coupled side-by-side via snap fasteners.

In one embodiment, in response to one external force applied on the button, the power generator is arranged to generate two electrical pulses, and the communication modules is arranged to generate two control commands of radio signal.

In one embodiment, the waterproof assembly comprises at least a waterproof cover and at least a ring shaped waterproof wall, wherein the waterproof wall is extended from the waterproof cover and is tightly extended at a waterproof groove at a bottom cover of the housing. The waterproof passive wireless controller further comprises at least one resetting module disposed in the waterproof chamber, wherein, in response to the external force, the driver assembly is driven to move to the resetting module which is separated by the waterproof cover in a waterproof manner, such that after the power generator is actuated by the resetting module to generate the first electrical pulse, the power generator is reset to move back to its original position by the resetting module to generate the second electrical pulse.

In one embodiment, the power generators are coupled with each other via a snap fit connection.

In one embodiment, the waterproof passive wireless controller further comprises at least a bottom cover, wherein the power generator and the communication module are disposed on the bottom cover. Each of the driver assemblies serves as the top cover of the waterproof passive wireless controller, wherein the driver assembly and the bottom cover are coupled with each other via the snap-fit connection.

In one embodiment, at least a shaft fastener is provided at the driver assembly, wherein at least a supporting shaft is provided at the waterproof cover. The supporting shaft is coupled at the shaft fastener, such that the supporting shaft forms a pivot axle of the driver assembly to enable the pivotal movement of the driver assembly.

In one embodiment, the resetting module comprises at least a resetting member and at least an elastic accelerating element. An elastic accelerating pressing member is provided at an inner side of the driver assembly. In response to the external force to move the driver assembly, at least a waterproof movable portion of the waterproof cover is pressed by the driver assembly pressing member. The waterproof movable portion further has a plurality of waterproof cover protrusions provided at the surface thereof to press against the elastic accelerating member. One end of the elastic accelerating member is coupled at the power generator to accelerate the movement of the power generator. Another end of the elastic accelerating member is pressed against the resetting member. When the external force is release, the driver assembly, the power generator and the elastic accelerating member are reset by the resetting member.

In one embodiment, the bottom cover further has at least a power generator mounting groove and comprises a power generator mounting member. The power generator mounting member comprises a plurality of power generator mounting side panels to define a power generator mounting groove between every two of the adjacent power generator mounting side panels.

In one embodiment, the bottom cover further comprises a power generator fastener provide at each of the power generator mounting side panels, wherein the power generator further comprises a corresponding fastener to couple with the power generator fastener, such that each of the power generators is securely coupled at the power generator mounting groove.

In one embodiment, the elastic accelerating member is supported between the resetting member and the waterproof cover protrusions.

In one embodiment, the power generator comprises at least a magnetic element set, and at least a coil assembly and at least a center shaft. The coil assembly is encircled around the center shaft. The magnetic element set comprises a permanent magnet member, a top magnetic conductive cover, a bottom magnetic conductive cover, wherein the top magnetic conductive cover and the bottom magnetic conductive cover are located at two opposite sides of the permanent magnet member respectively. The elastic accelerating member is coupled to the center shaft to drive the center shaft to alternately contact with the top magnetic conductive cover and the bottom magnetic conductive cover in a synchronization manner for generating a direction change of the magnetic line to generate the induced current through the coil assembly.

In one embodiment, the resetting member is embodied as at least a reset torsion spring, and the elastic accelerating member is embodied as at least a spring piece.

In one embodiment, the waterproof cover of the waterproof assembly further has a light retention portion preferably having a ring shape, a waterproof cover main portion, and a shaft supporting portion. The waterproof movable portion is protruded and coupled at the waterproof cover main portion. The light retention portion is protruded from the waterproof cover main portion to form at least an indicator hole. The shaft supporting portion is arranged to support the supporting shaft, wherein the waterproof cover main portion, the light retention portion, and the shaft supporting portion are integrally formed with each other to form an integrated member.

In one embodiment, the housing comprises at least a top cover and at least a bottom cover, wherein the driver assembly is coupled at the top cover. The waterproof assembly further comprises at least one waterproof cover and at least one waterproof wall, wherein the waterproof wall is extended from the waterproof cover and is tightly extended in a waterproof groove at the bottom cover of the housing. The edge of the waterproof cover is pressed against the edge of the bottom cover via the top cover, such that the waterproof chamber is formed between the waterproof cover and the bottom cover.

In one embodiment, the top cover has a driver assembly hole for mounting the driver assembly.

In one embodiment, the waterproof passive wireless controller further comprises at least a lever, at least a resetting member, at least an elastic accelerating member, and at least one micro switch, wherein the lever, the resetting member, the elastic accelerating member, and the micro switch are disposed in the waterproof chamber. The micro switch is electrically connected to the communication module, wherein the micro switch is pre-electrified to activate communication module. The driver assembly is separated from the lever by the waterproof cover in a waterproof manner and is pressed by the lever, wherein the lever is pressed against the elastic accelerating member. Accordingly, the elastic accelerating member is coupled to the power generator to accelerate the movement of the power generator. The resetting member is arranged to reset the driver assembly, the lever, the power generator, and the elastic accelerating member back to their original positions.

In one embodiment, the lever comprises at least a first lever side wing, at least a second lever side wing, at least a lever body, and at least a lever point. The first lever side wing and the second lever side wing are sidewardly and symmetrically extended at two sides of the lever body respectively. The lever point is upwardly protruded from the lever body. The driver assembly is separated from the lever body by the waterproof cover in a waterproof manner and is pressed by the lever body, wherein the lever point is synchronously pressed on the elastic accelerating member.

In one embodiment, the bottom cover comprises a lever stopper coupled at, preferably hooked at, the lever as a pivot point for enabling the pivotal movement of the lever.

In one embodiment, the power generator comprises at least a magnetic element set, and at least a coil assembly and at least a center shaft. The coil assembly is encircled around the center shaft. The magnetic element set comprises a permanent magnet member, a top magnetic conductive cover, a bottom magnetic conductive cover, wherein the top magnetic conductive cover and the bottom magnetic conductive cover are located at two opposite sides of the permanent magnet member respectively. The elastic accelerating member is coupled to the center shaft to drive the center shaft to alternately contact with the top magnetic conductive cover and the bottom magnetic conductive cover in a synchronization manner for generating a direction change of the magnetic line to generate the induced current through the coil assembly.

In one embodiment, the resetting member is embodied as at least a reset torsion spring, and the elastic accelerating member is embodied as at least a spring piece.

In one embodiment, in response to one external force applied on the driver assembly, the power generator is arranged to generate two electrical pulses via an actuation of the driver assembly and the resetting of the driver assembly.

In accordance with another aspect of the invention, the present invention comprises a passive wireless control method via a waterproof passive wireless controller, the passive wireless control method comprises the step of: in response to each actuation of a driver assembly, a power generator of the waterproof passive wireless controller generating two electrical pulses in order to generate two corresponding wireless control signals for different operations.

In one embodiment, the method further comprises a step of: in each actuation of the driver assembly, pivotally moving the driver assembly of the waterproof passive wireless controller by an external force.

In one embodiment, the method further comprises a step of: actuating the power generator by the pivotal movement of the driver assembly in order to generate the first electrical pulse.

In one embodiment, the method further comprises a step of: when the external force is released, resetting the driver assembly back to its original position that the power generator generates the second electric pulse.

In one embodiment, the method further comprises a step of: driving at least an elastic accelerating member by the driver assembly, wherein the elastic accelerating member is coupled to the power generator, such that when the drive module is actuated to drive the elastic accelerating member, the power generator is actuated by the elastic accelerating member to generate the first electrical pulse.

In one embodiment, the method further comprises a step of: when the external force is released at the driver assembly, resetting the driver assembly and the elastic accelerating member, such that the power generator generates the second electrical pulse.

In one embodiment, the method further comprises a step of: in each actuation of the driver assembly, the power generator is arranged to generate two electrical pulses respectively transmitting to the communication module through two different paths. One of the paths is communicatively connected to the power input terminal of the wireless communication module for providing a working power supply of the waterproof passive wireless controller. Another path is communicatively connected to the electrical level signal input terminal of the wireless communication module and is operatively connected to the I/O port of the wireless communication module. The communication module is configured to generate a preset coding data in response to an electrical level change at the I/O port of the communication module.

In accordance with another aspect of the invention, the present invention comprises a passive wireless control system which comprises at least a waterproof passive wireless controller and at least a command actuator, wherein the waterproof passive wireless controller is arranged to wireless send a control signal to the command actuator in order to control the command actuator for processing different operations.

In one embodiment, the passive wireless control system is a smart toilet system to which comprises at least a waterproof passive wireless controller and at least a toilet command actuator, wherein the waterproof passive wireless controller is arranged to wireless send a control signal to the toilet command actuator in order to control the toilet command actuator for processing different operations of the smart toilet system.

In one embodiment, the passive wireless control system is a bathroom system which comprises at least a waterproof passive wireless controller and at least a bathroom command actuator, wherein the waterproof passive wireless controller is arranged to wireless send a control signal to the bathroom command actuator in order to control the bathroom command actuator for processing different operations of the bathroom system.

In one embodiment, the passive wireless control system is a water heater system which comprises at least a waterproof passive wireless controller and at least a water heater command actuator, wherein the waterproof passive wireless controller is arranged to wireless send a control signal to the water heater command actuator in order to control the water heater command actuator for processing different operations of the water heater system.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

It is appreciated that the terms "longitudinal", "transverse", "upper", "lower", "front", "rear", "left", "right", "vertical", "horizontal", "top", "bottom", "exterior", and "interior" in the following description refer to the orientation or positioning relationship in the accompanying drawings for easy understanding of the present invention without limiting the actual location or orientation of the present invention. Therefore, the above terms should not be an actual location limitation of the elements of the present invention.

It is appreciated that the terms "one", "a", and "an" in the following description refer to "at least one" or "one or more" in the embodiment. In particular, the term "a" in one embodiment may refer to "one" while in another embodiment may refer to "more than one". Therefore, the above terms should not be an actual numerical limitation of the elements of the present invention.

Figure 1:
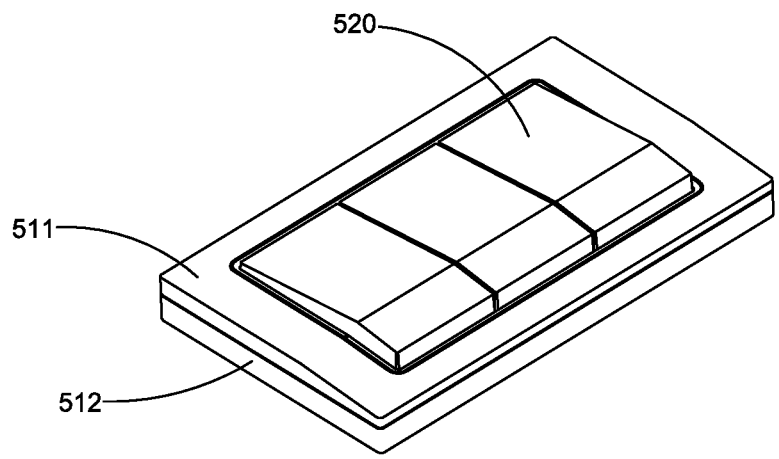
FIG. 1 is a perspective view of a waterproof passive wireless controller according to a first embodiment of the present invention.
Figure 2:
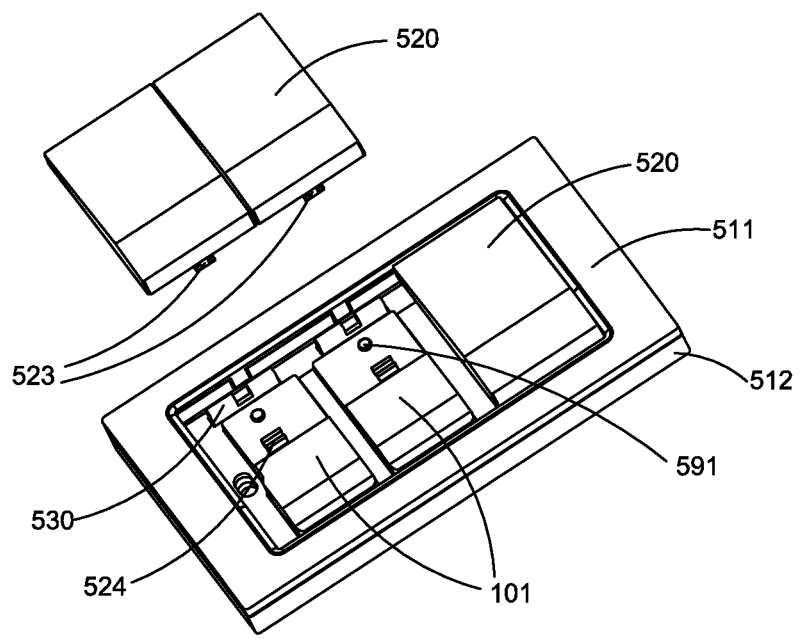
FIG. 2 is a partially exploded perspective view of the waterproof passive wireless controller according to the above first embodiment of the present invention.
Figure 3:
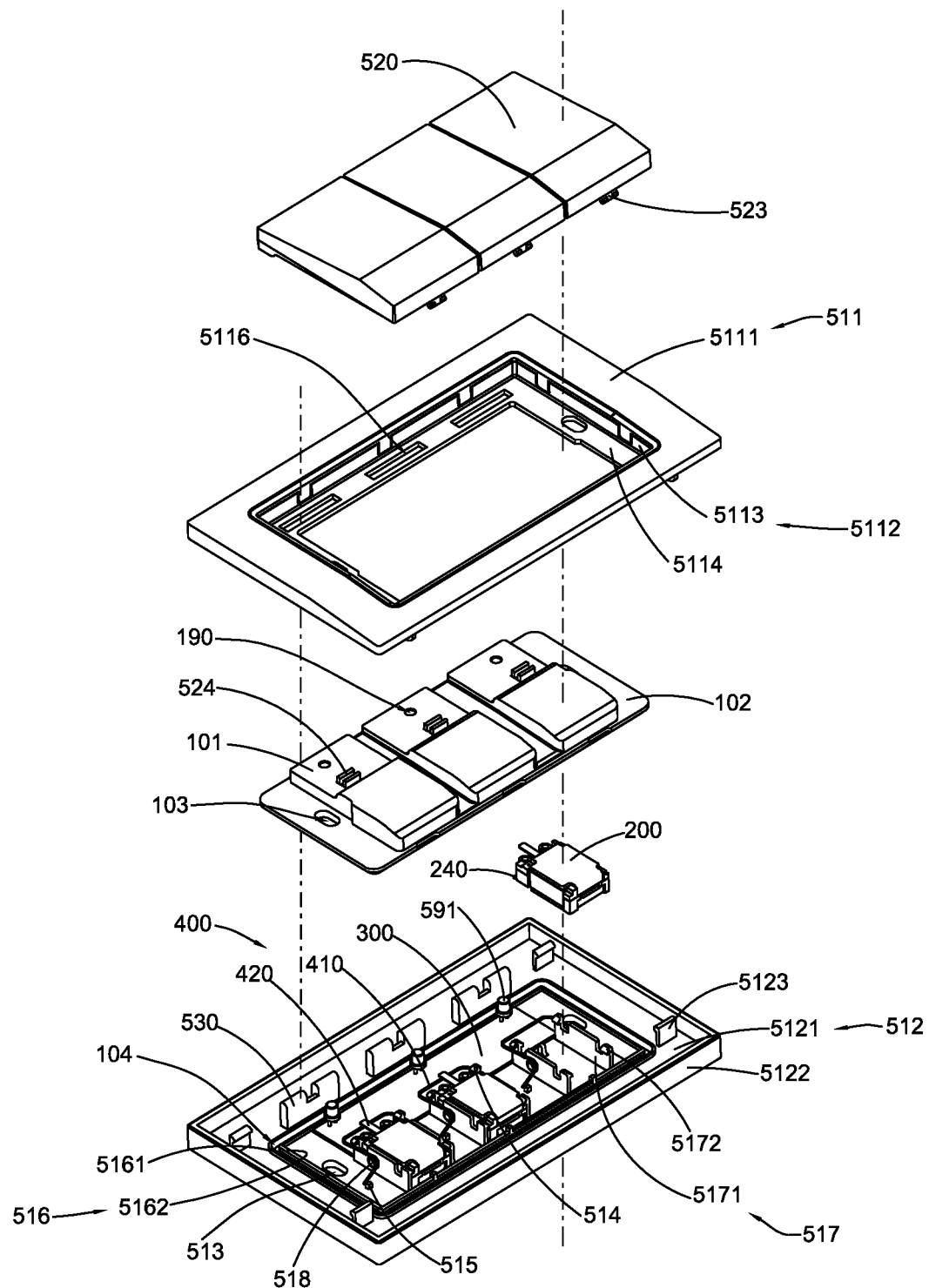
FIG. 3 is an exploded perspective view of the waterproof passive wireless controller according to the above first embodiment of the present invention.
Figure 4:
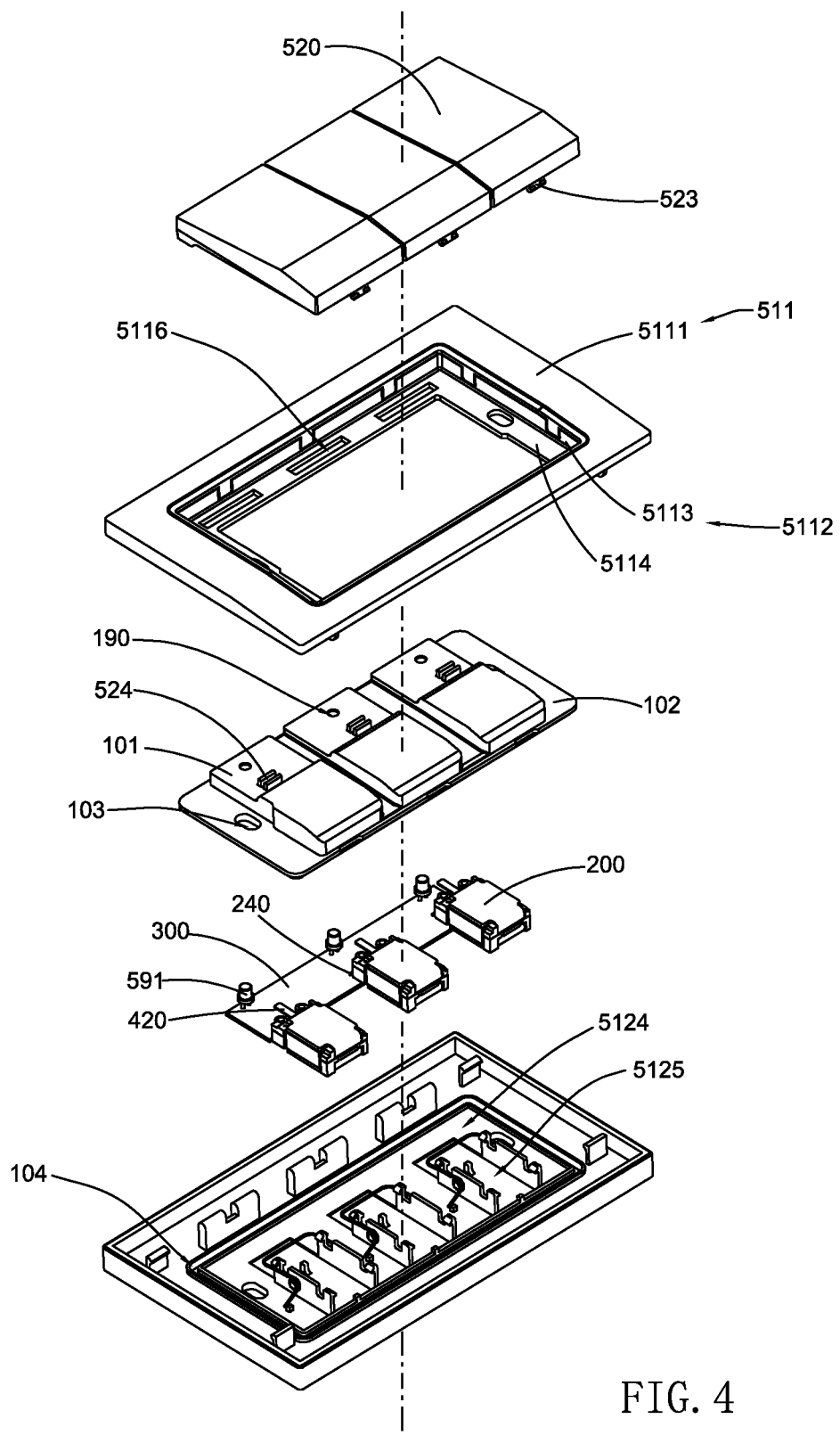
FIG. 4 is another exploded perspective view of the waterproof passive wireless controller according to the above first embodiment of the present invention.
Figure 5:
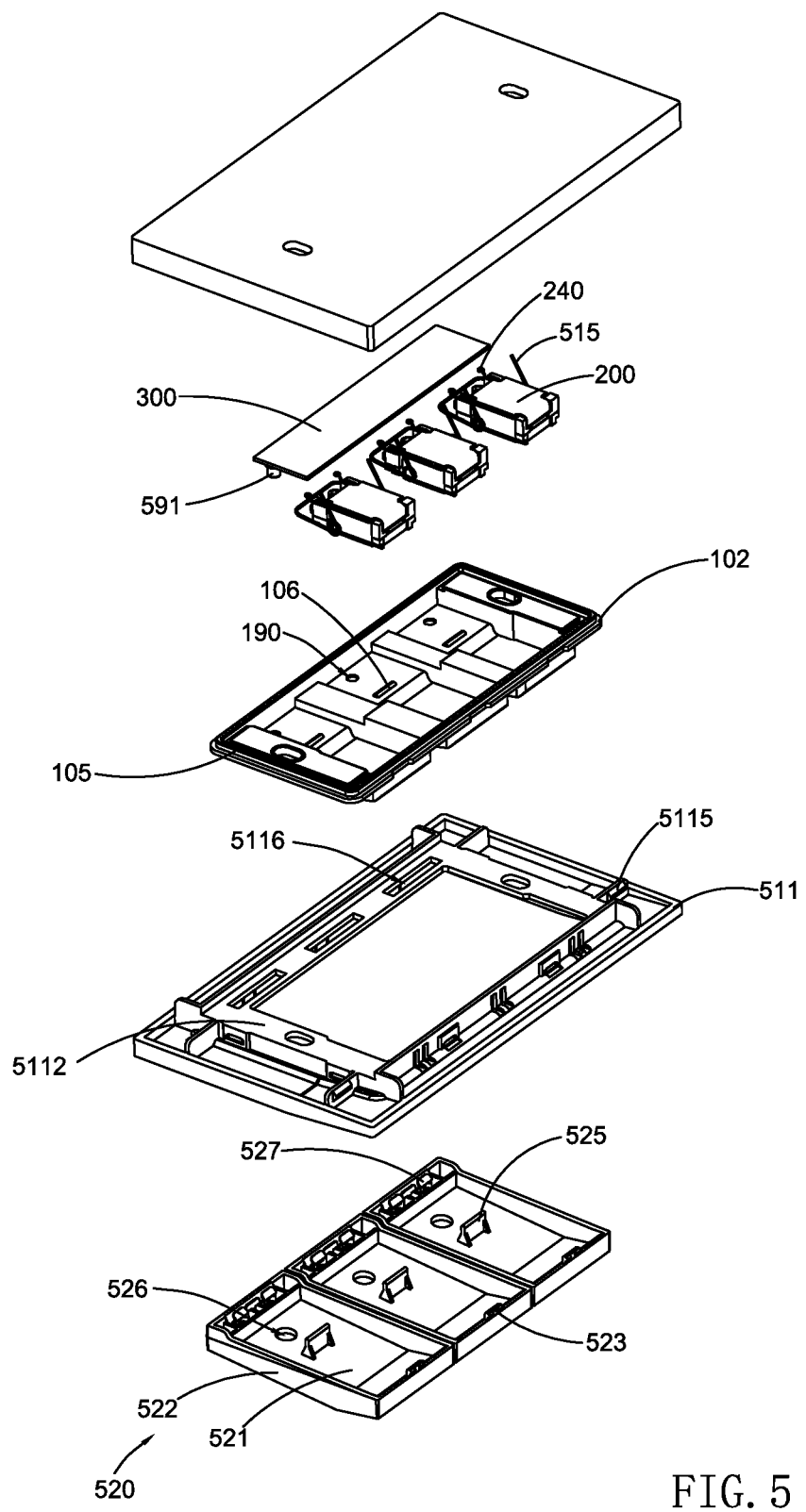
FIG. 5 is an exploded bottom perspective view of the waterproof passive wireless controller according to the above first embodiment of the present invention.
Figure 6:
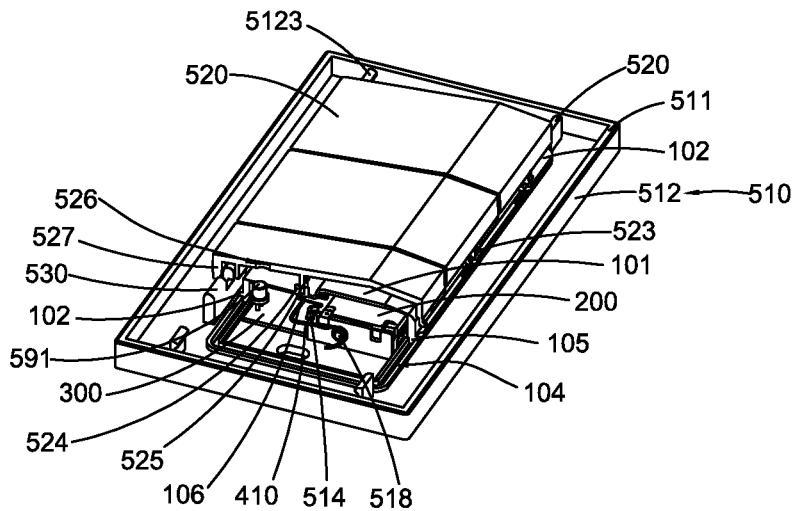
FIG. 6 is a perspective view of the waterproof passive wireless controller according to the above first embodiment of the present invention, illustrating the actuation module at a normal position.
Figure 7:
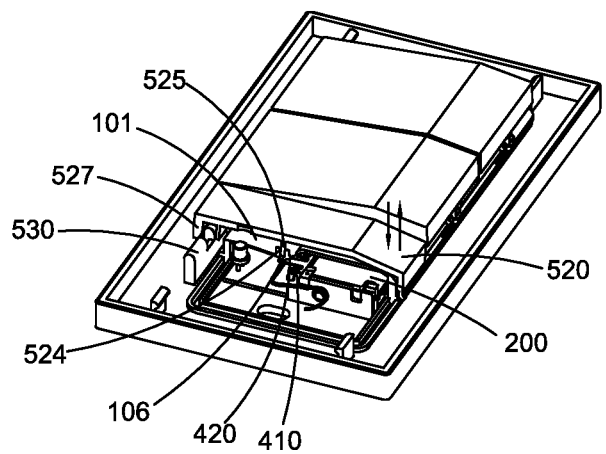
FIG. 7 is a perspective view of the waterproof passive wireless controller according to the above first embodiment of the present invention, illustrating the actuation module at an actuation position.
Figure 8:
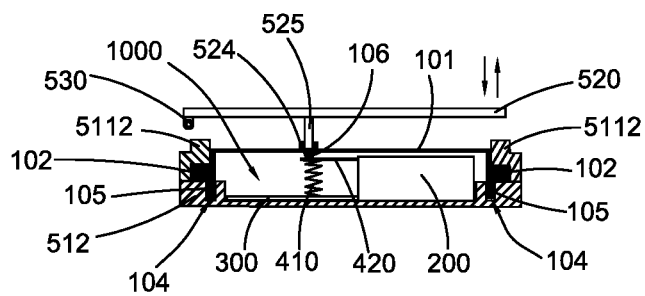
FIG. 8 is a sectional view of the waterproof passive wireless controller according to the above first embodiment of the present invention.
Figure 9:
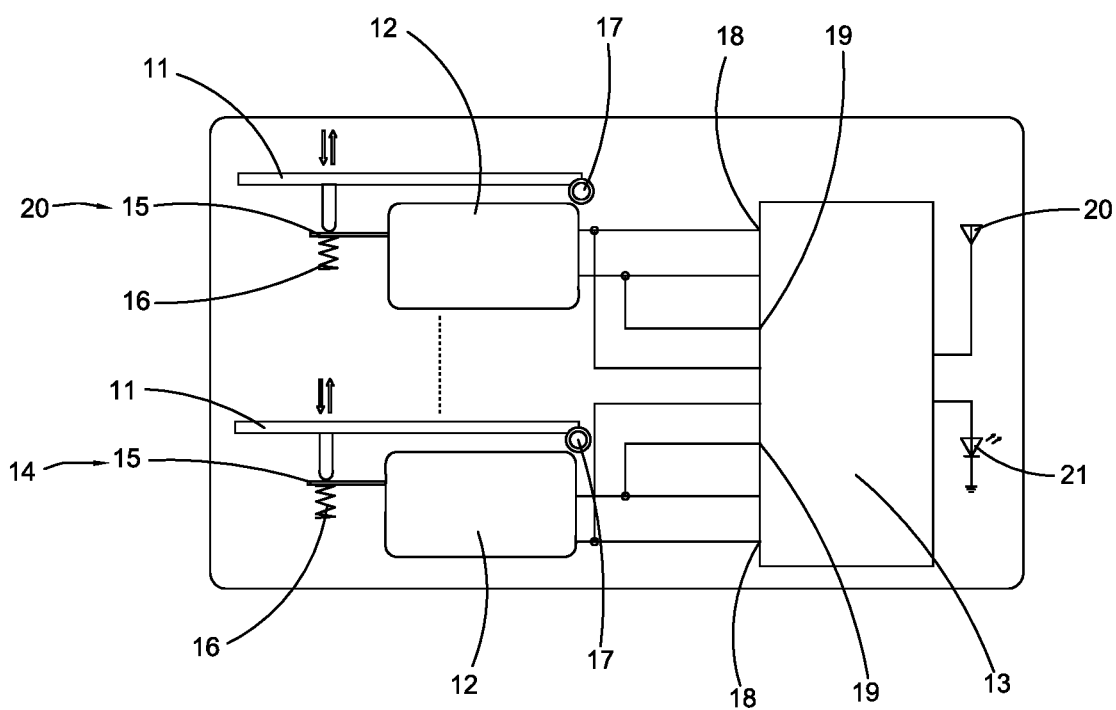
FIG. 9 is an electrical diagram of the waterproof passive wireless controller according to the above first embodiment of the present invention.
Figure 14:
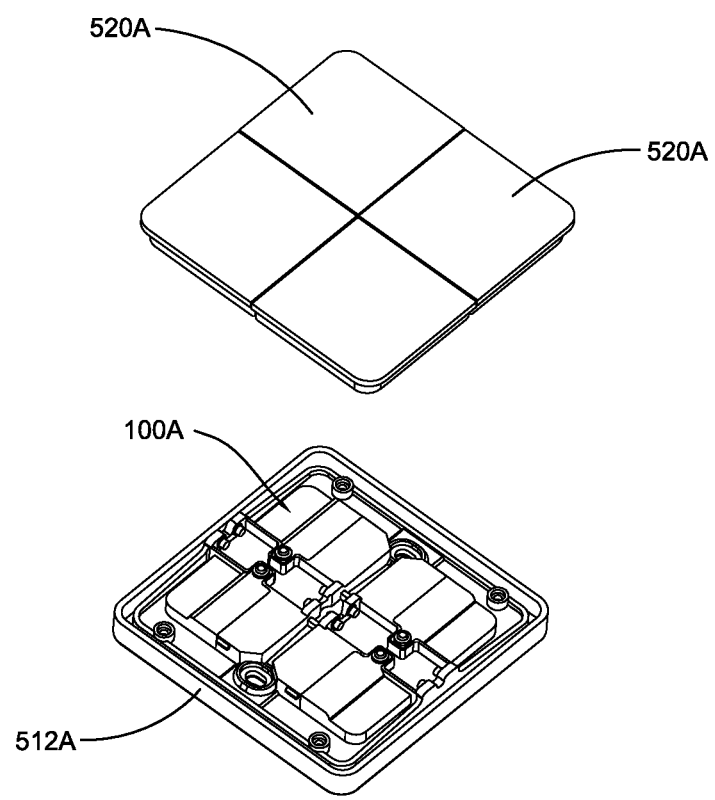
FIG. 14 is a partially exploded perspective view of the waterproof passive wireless controller according to the above second embodiment of the present invention.
Figure 15:
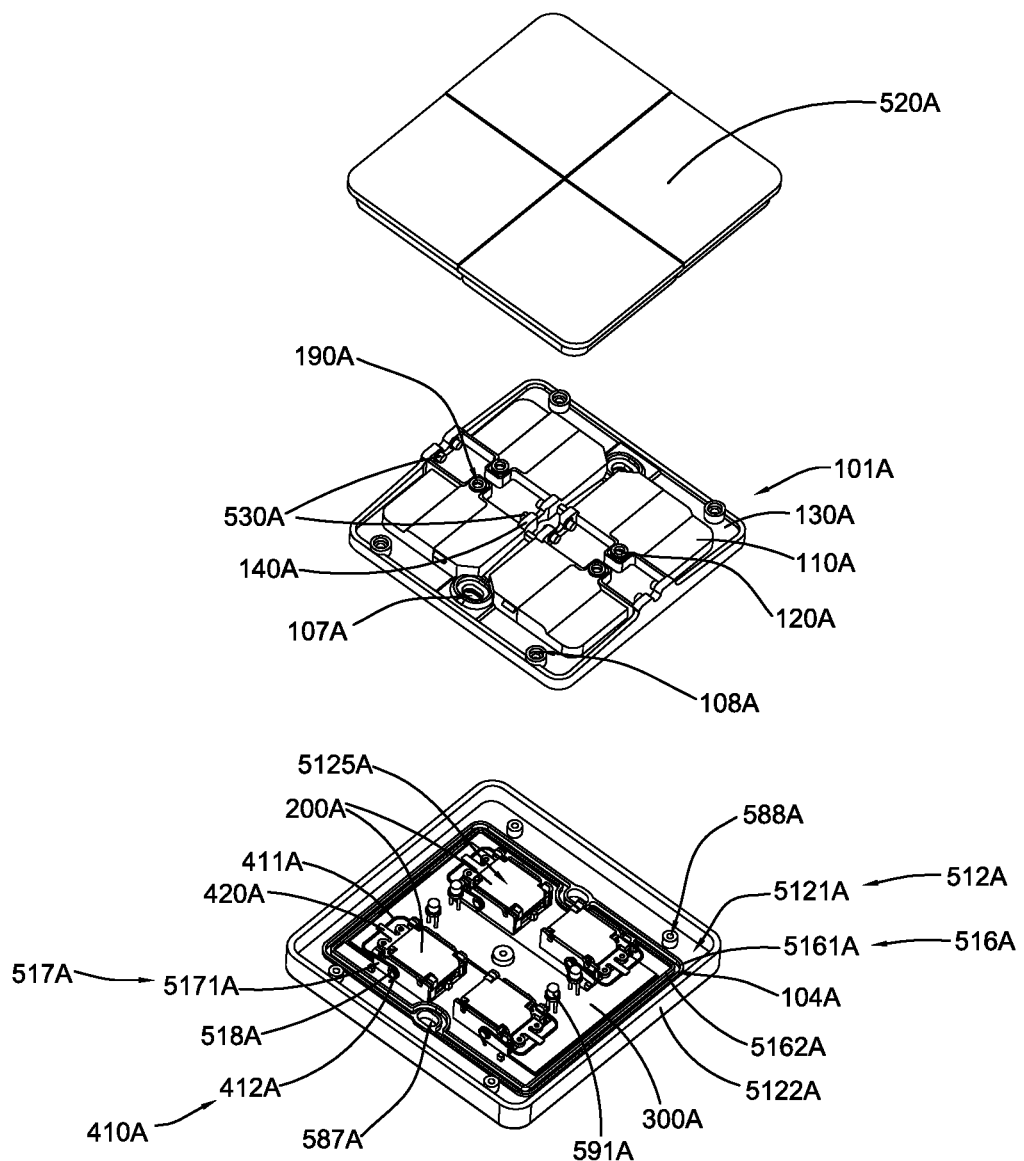
FIG. 15 is an exploded perspective view of the waterproof passive wireless controller according to the above second embodiment of the present invention.
Figure 16:
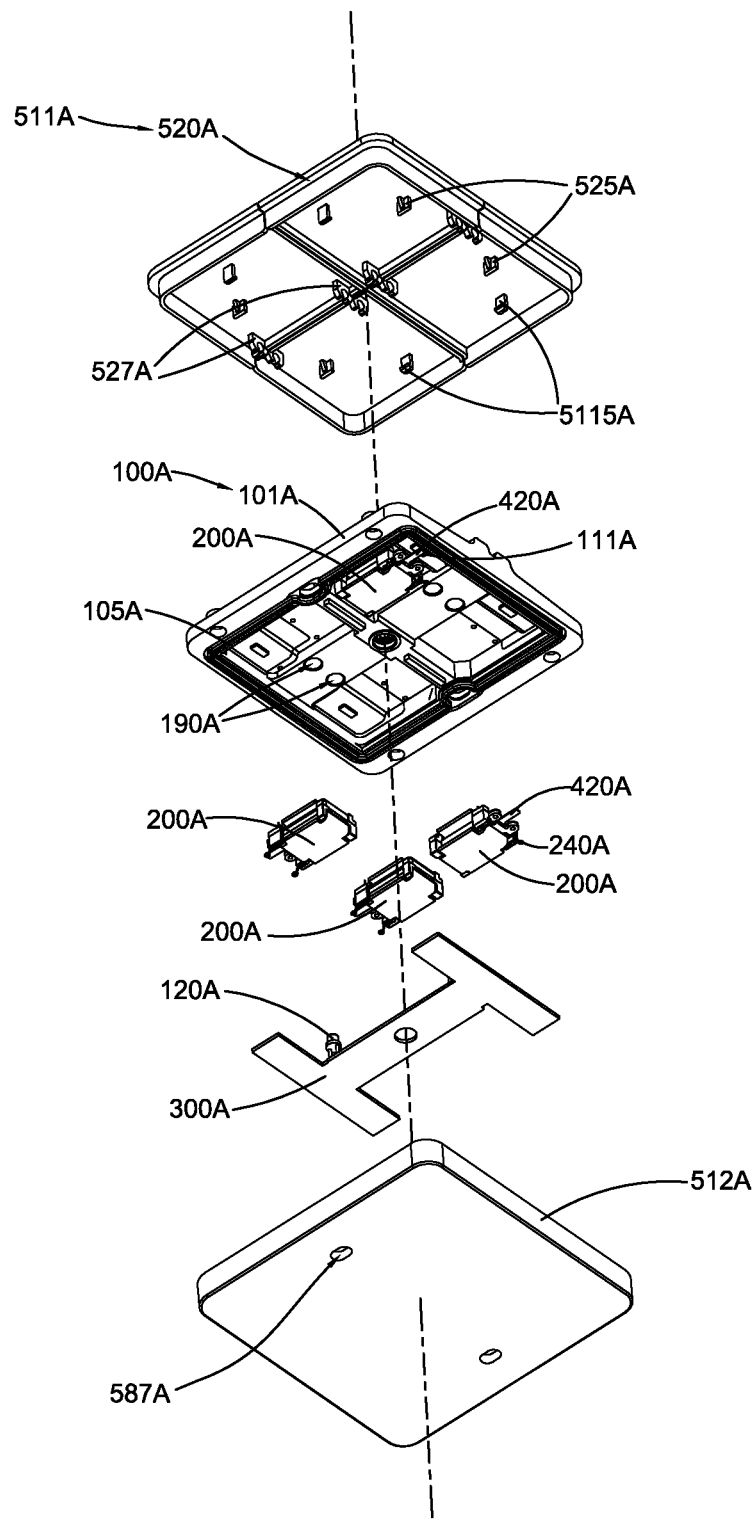
FIG. 16 is an exploded bottom perspective view of the waterproof passive wireless controller according to the above second embodiment of the present invention.
Figure 17:
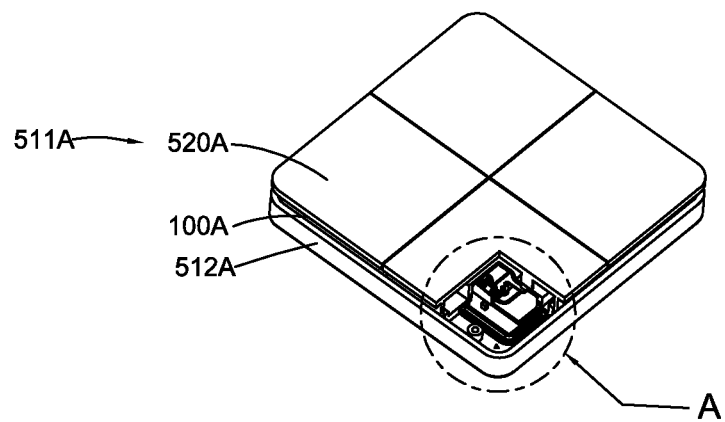
FIG. 17 is a partially perspective view of the waterproof passive wireless controller according to the above second embodiment of the present invention.
Figure 18:
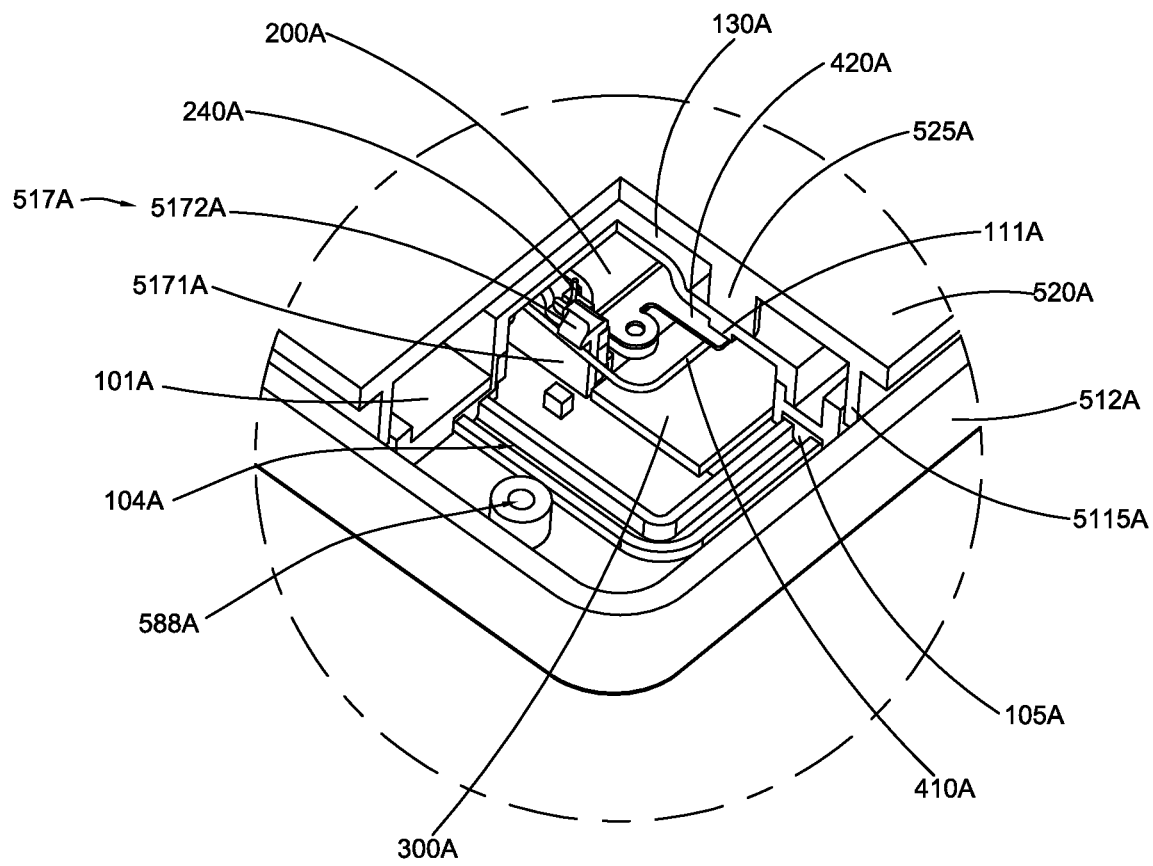
FIG. 18 is a partially enlarged perspective view of the waterproof passive wireless controller according to the above second embodiment of the present invention.
Figure 19:
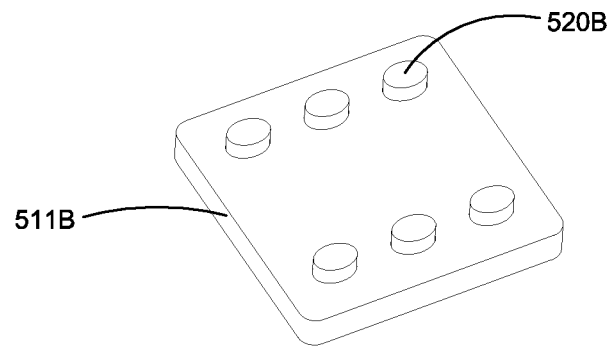
FIG. 19 is a perspective view of a waterproof passive wireless controller according to a third embodiment of the present invention.
Figure 20:
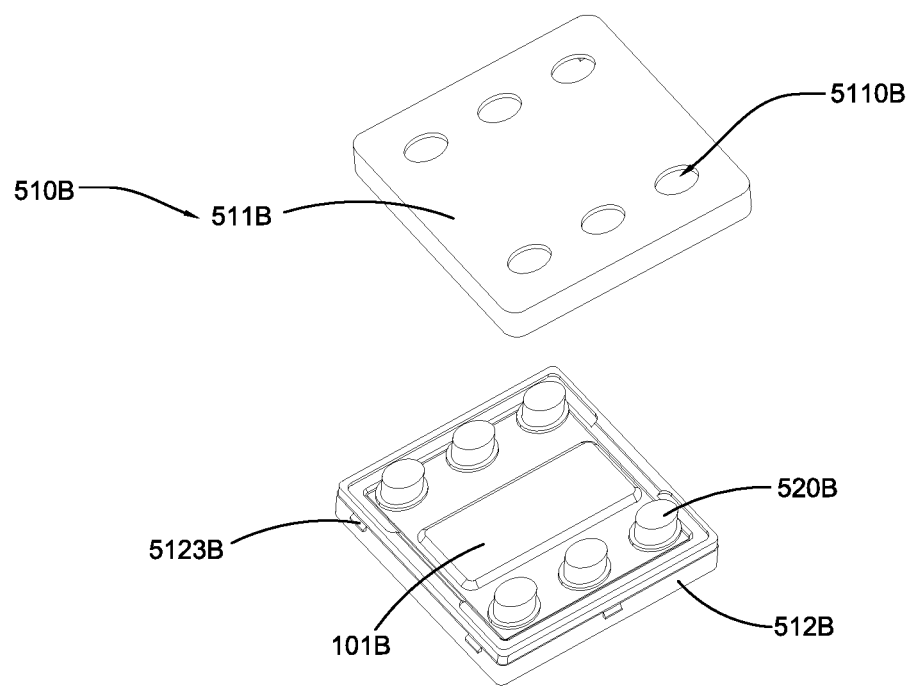
FIG. 20 is a partially exploded perspective view of the waterproof passive wireless controller according to the above third embodiment of the present invention.
Figure 21:
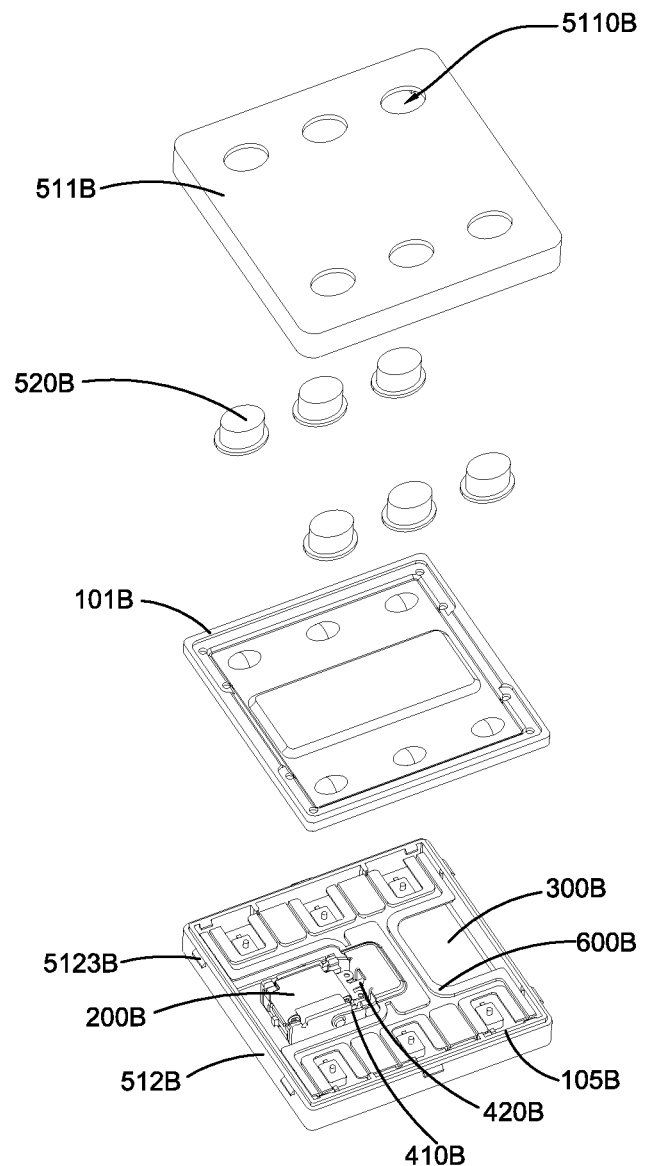
FIG. 21 is another partially exploded perspective view of the waterproof passive wireless controller according to the above third embodiment of the present invention.
Figure 22:
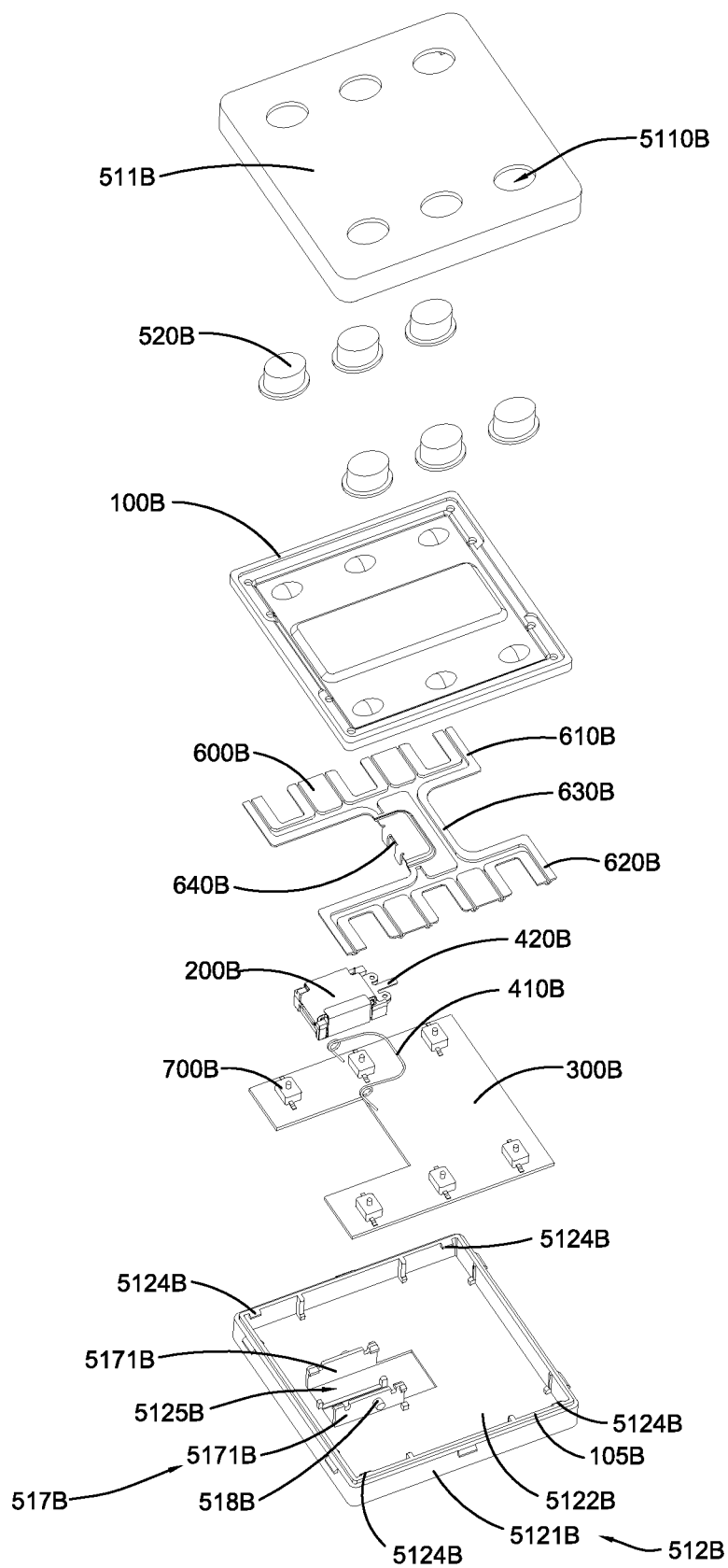
FIG. 22 is an exploded perspective view of the waterproof passive wireless controller according to the above third embodiment of the present invention.

Referring to FIG. 9 of the drawings, a waterproof passive wireless controller according to a first embodiment of the present invention is illustrated, wherein the waterproof passive wireless controller comprises at least one driver assembly 11, at least one power generator 12, a wireless communication module 13, and a resetting module 14. The resetting module 14 comprises an elastic element 15 and a resilient element 16, wherein the elastic element 15 is embodied as an elastic metal plate and the resilient element 16 is embodied as a spring. The driver assembly 11 has a pivot point 17 adapted for being pushed or moved by an external force. The wireless communication module 13 is electrically connected to the power generator 12 through a power input terminal 18 and an electrical level signal input terminal 19. The waterproof passive wireless controller further comprises an antenna 20 electrically connected to the wireless communication module 13 and a light emitter 21. As shown in FIG. 14, the driver assembly 11 is embodied as a press button adapted to be actuated via the external force. For example, when the press button is pressed or actuated, the elastic element 15 of the resetting module 14 is moved by the actuation of the driver unit 11, the power generator 12 is actuated to convert the kinetic energy of the elastic element 15 into an electrical energy as a power supply to the wireless communication module 13. During this process, the resilient element 16 is compressed to store the resilient potential energy. Once the external force at the driver assembly 11 is released, the resilient element 16 of the resetting module 14 is returned to its original form to release the potential energy to the elastic element 15 and the driver assembly 11, so as to return the elastic element 15 and the driver assembly 11 at their original positions. Accordingly, the waterproof passive wireless controller can incorporate with a plurality of power generators 12 being actuated independently, wherein the power generators 12 are able to be independently actuated by the driver assemblies 11 respectively in order to generate the electrical energy to the wireless communication module 13. After the wireless communication module 13 is powered, signals will be transmitted by radio waves or light waves via the antenna 20 and the light emitter 21. It should be understood that the resilient element 16 and the elastic element 15 are merely as an example, and can use other elements made of an elastic material, such that it should not be limited in the present invention. Thus, the driver assembly 11 can generate a driver information in response to the external force. For example, the driver information can be switching on other controller devices or switching off other controller devices, etc. The wireless communication module 13 is configured to send a wireless control signal corresponding to the driver information after the wireless communicated module 13 is powered or electrified, wherein other controller device can be controlled once the wireless control signal is received thereby so as to provide a function corresponding to the driver information, for example, switching on or off the light apparatus. It should be understood that the transmission of the wireless control signal from the wireless communication module 13 should not be limited by the antenna 20 or the light emitter 21. In other words, the wireless control signal should not be limited by radio wave or light wave, and the transmission method can be provided in the present invention in response to the form of the signal.

In one example, when the driver assemblies 11 are implemented as a plurality of actuation buttons, when the waterproof passive wireless controller is operated by an operator to press or actuate one of the actuation buttons being set as "switch on the light", the corresponding actuation button is pivotally moved at its pivot point 17 in response to the external pressing force applied by the operator. The elastic element 15 is moved downwardly by the pivotal depression of the driver assembly 11. Once the elastic element 15 is moved downwardly, the power generator 12 will convert the kinetic energy into the electrical energy for generating a first electrical pulse. When the external pressing force is released from the actuation button, the elastic element 15 is pushed upwardly to return to its original position by the resilient element 16. Accordingly, when the elastic element 15 is reset to its original position, the power generator 12 will convert the kinetic energy into the electrical energy for generating a second electrical pulse. The first electrical pulse and the second electrical pulse generated by the power generator 12 will transmit to the wireless communication module 13 through two different paths. As shown in FIG. 9, one of the paths is communicatively connected to the power input terminal 18 of the wireless communication module 13 and is operatively connected to the AC interface of the wireless communication module 13 for providing a working power supply of the waterproof passive wireless controller of the present invention. Another path is communicatively connected to the electrical level signal input terminal 19 of the wireless communication module 13 and is operatively connected to the I/O port of the wireless communication module 13. The communication module 13 is configured to generate a preset coding data in response to an electrical level change at the I/O port of the wireless communication module 13, wherein the coding data matches with the driver information preset by the actuation button. After the wireless communication module 13 receives the power and the electrical level command, the control information is sent in form of radio waves or light waves to control the controller devices to operate thereof, such as switching on the lighting apparatus.

It should be understood that the foregoing examples are preset to be "switching on" is merely as one of the applications, and this example should not be limited in the present invention.

Therefore, comparing to the conventional method using the conductive rubber or mechanical switch for output command generation, the waterproof passive wireless controller of the present invention use a physical configuration to generate the command signal. Accordingly, the present invention does not use any mechanical configuration to generate the command, but uses an electrical pulse configuration to generate the command. When the driver assembly 11 implemented as the press button is actuated or pressed, the power generator 12 will generate a positive electrical pulse. When the driver assembly 11 is reset to its original position, the power generator 12 will generate a negative electrical pulse. In other words, as long as the power generator 12 generates the electrical pulse, the driver assembly 11 is determined whether it is pressed down or pushed back upwardly. As a result, the wireless communication module 13, such as a single chip microcomputer, can generate the corresponding key command. Therefore, the service life span and reliability of the waterproof passive wireless controller of the present invention will be greatly enhanced by replacing the conventional mechanical method.

Figure 10:
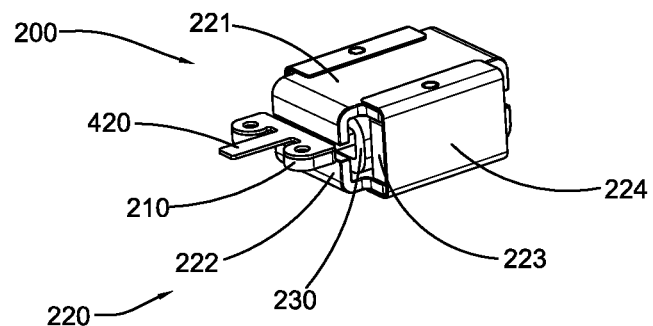
FIG. 10 is a perspective view of a power generator of the waterproof passive wireless controller according to the above first embodiment of the present invention.
Figure 11:
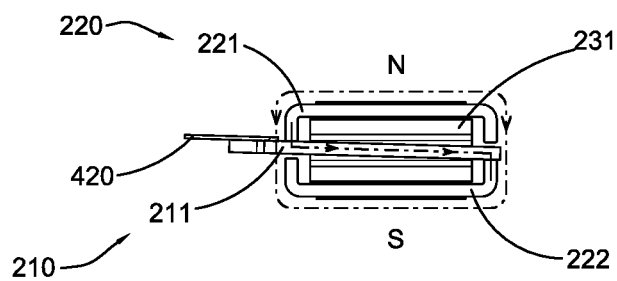
FIG. 11 illustrates an operation of the power generator of the waterproof passive wireless controller according to the above first embodiment of the present invention.
Figure 12:
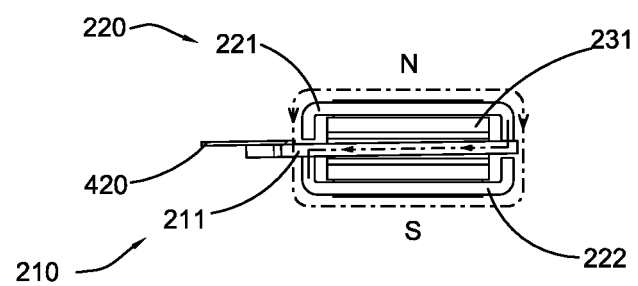
FIG. 12 also illustrates an operation of the power generator of the waterproof passive wireless controller according to the above first embodiment of the present invention.
Figure 13:
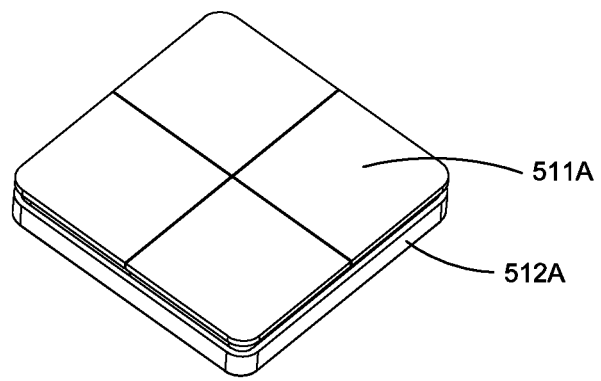
FIG. 13 is a perspective view of a waterproof passive wireless controller according to a second embodiment of the present invention.

It is worth mentioning that the power generator 12 is configured to convert mechanical form of kinetic energy into electrical energy, wherein the structure of the power generator 12 can be altered or modified, except that the conventional structure using conventional mechanical energy. Accordingly, the altered or modified structure is shown in FIGS. 10 to 12 (the detail structure will be described later), or other reasonable structure such as the patents previously applied the inventor, such that the structure should not be limited.

Referring to FIGS. 1 to 8 of the drawings, the waterproof passive wireless controller according to the preferred embodiment of the present invention is illustrated. The waterproof passive wireless controller has good waterproof performance and can be applied to a bathroom, kitchen, outdoor, etc. The waterproof passive wireless controller comprises a waterproof assembly 100, a power generator 200, a communication module 300, a resetting module 400, a housing 510, and a driver assembly 520. The waterproof assembly 100 and the housing 510 form a waterproof chamber 1000 in a sealed and enclosed manner, wherein the power generator 200, the communication module 300 and the resetting module 400 are supported within the waterproof chamber 1000 while the driver assembly 520 is located out of the waterproof chamber 1000. The driver assembly 520 is disposed at an external of the casing 510 and is arranged to drive the resetting module 400 within the waterproof chamber 1000 in response to an external force. The resetting module 400 is configured to drive the power generator 200 for converting the mechanical form of kinetic energy into electrical energy, so as to supply electrical power to the communication module 300, and to generate an electrical pulse at the same time. When the external force is released, the resetting module 400 is configured to drive the power generator 200 to reset and move back to its original position, such that the power generator 200 is arranged to generate the electric pulse again. Therefore, the waterproof passive wireless controller of the present invention not only has excellent waterproof performance, but also is able to combine different command via the electrical pulse generated by the power generator 200 so as to provide different selectively adjustments by the waterproof passive wireless controller.

Particularly, the waterproof passive wireless controller of the preferred embodiment of the present invention provides a waterproof structure. The waterproof assembly 100 comprises a waterproof cover 101 and a waterproof wall 105, wherein the waterproof wall 105 is integrally formed with the waterproof cover 101. The waterproof wall 105 is extended from the waterproof cover 101 and is tightly extended at a waterproof groove 104 at a bottom cover 512 of the housing 510. In addition, the waterproof chamber 1000 is formed between the waterproof cover 101 and the waterproof wall 105 the waterproof assembly 100 and the bottom cover 512 of the housing 510, wherein any liquid, such as water, cannot enter into the waterproof chamber 1000.

Accordingly, the bottom cover 512 has a bottom cover main portion 5121 and a bottom cover side portion 5122. The bottom cover side portion 5122 is extended upwardly from a peripheral edge of the bottom cover main portion 5121, wherein the waterproof groove 104 is formed at the bottom cover main portion 5121. A waterproof groove forming member 516 is formed at the bottom cover main portion 5121, wherein the waterproof groove forming member 516 comprises an outer surrounding wall 5161 upwardly extended from the bottom cover main portion 5121 and an inner surrounding wall 5162 spaced apart from the outer surrounding wall 5161. The waterproof groove 104 is formed between the outer surrounding wall 5161 and the inner surrounding wall 5162. Preferably, the waterproof wall 105 of the waterproof assembly 100 is made of elastic waterproof material, such as a rubber or a silicone. The distance between the outer surrounding wall 5161 and the inner surrounding wall 5162, i.e., the width of the waterproof groove 104, is slightly smaller than the thickness of the waterproof wall 105.

Accordingly, the waterproof wall 105 is closely and seamlessly attached to the waterproof groove 104 via its own elasticity. Therefore, liquid such as water cannot enter into the waterproof chamber 1000 from the gap between the waterproof wall 105 and the bottom cover 512.

It should be understood that in this embodiment, the waterproof groove 104 is formed by the waterproof groove forming member 516 upwardly protruding from the bottom cover 512 as an example. Alternatively, the waterproof groove 104 can be formed by other reasonable structure. For example, in other embodiments, the bottom cover main portion 5121 of the bottom cover 512 is indented and recessed corresponding to the waterproof chamber 1000 to directly form the waterproof groove 104.

Furthermore, the housing 510 further comprises a top cover 511 coupled to the bottom cover 512 via a cover snap assembly, and tightly pressed at the waterproof assembly 100 to prevent the waterproof assembly 100 from being detached so as to enhance the sealing configuration of the waterproof chamber 1000. The top cover 511 has a top cover main portion 5111 constructed as an annular frame and a top cover rim 5112, wherein the top cover rim 5112 is annularly formed at an inner surrounding edge of the top cover main portion 5111. The outer peripheral edge of the waterproof cover 101 is outwardly extended to form an outer edge 102. In other words, the outer edge 102 is outwardly extended from the waterproof wall 105 and the waterproof cover 101. Preferably, the outer edge 102, the waterproof wall 105 and the waterproof cover 101 are integrated to form an integral member. The outer peripheral edge of the waterproof cover 101 of the waterproof assembly 100, i.e., the outer edge 102, is tightly pressed between a main rim portion 5113 of the top cover rim 5112 and the bottom cover 512. Thus, the outer peripheral edge of the waterproof cover 101 of the waterproof assembly 100 is extended out of the waterproof chamber 1000 to further prevent the liquid such as water entering into the waterproof chamber 1000.

According to the preferred embodiment, the top cover 511 and the bottom cover 512 are connected by at least a top cover fastener 5115 and at least a bottom cover fastener 5123 provided thereat respectively, wherein the top cover fastener 5115 and the bottom cover fastener 5123 are embodied as top and bottom snap fasteners respectively. Particularly, the top cover fastener 5115 is formed at an inner side surface of the top cover main portion 5111 of the top cover 511, and the bottom cover fastener 5123 is formed at the bottom cover main portion 5121 of the bottom cover 512, such that when the top cover fastener 5115 and the bottom cover fastener 5123 are fastened with each other, the bottom cover 512 and the top cover 511 are coupled with each other to enhance a sealing effect between the waterproof assembly 100 and the housing 510. Thus, the bottom cover 512 and the top cover 511 can be easily disassembled via the snap fastening connection.

A waterproof sealing element 105, such as a rubber sealer, is disposed at the waterproof groove 104 at the bottom cover 512 to tightly couple at the waterproof wall 105. Thus, the top cover rim 5112 is tightly pressed at the outer edge 102, such that each of the power generators 200 and at least a portion of the communication module 300 are sealed and received in the waterproof chamber 1000.

There is at least a waterproof assembly fixing hole 103 formed at the outer edge 102. There are at least a bottom cover fixing hole 513 formed at the bottom cover main portion 5121 of the bottom cover 512. A fixing hole is correspondingly formed at the top cover 511. The bottom cover fixing hole 513, the waterproof assembly fixing hole 103 and fixing hole at the top cover 511 are aligned with each other that a fastener is able to pass therethrough for further strengthening the tightness between the waterproof assembly 100 and the housing 510, and further preventing liquid such as water from entering into the waterproof chamber 1000.

Furthermore, the driver assembly 520 is located outside the waterproof chamber 1000, wherein, n response to the external force to the driver assembly 520, the driver assembly 520 is arranged to drive the resetting module 400 through the waterproof cover 101 of the waterproof assembly 100 so as to drive the power generator 200 to move. Thus, the power generator 200 is arranged to convert the mechanical form of kinetic energy into electrical energy without affecting the waterproof ability, and is arranged to supply the electrical power to the communication module 300. Therefore, the waterproof passive wireless controller of the present invention is further provided with the waterproof ability.

According to the preferred embodiment, the driver assembly 520 comprises three press buttons arranged side-by-side. Correspondingly, the waterproof cover 101 of the waterproof assembly 101 is shaped and sized matching with the press button, such that each press button of the driver assembly 520 is sealed and enclosed by the waterproof cover 101. It is worth mentioning that the number of press button and the size of the waterproof cover 101 are illustrated as one of the examples and should not be limited in the present invention.

Particularly, the driver assembly 520 has a driver assembly base portion 521 and a driver assembly side portion 522, wherein the driver assembly side portion 522 is sidewardly extended from the driver assembly base portion 521. The driver assembly 520 further comprises a driver assembly fastener 523 provided at the driver portion side portion 522 to lock at the housing 510 so as to prevent the driver assembly 520 being detached therefrom. A supporting shaft 530 is coupled at the bottom cover 512. Correspondingly, a shaft coupler 527 is provided at an inner side of the driver assembly 520. A shaft hole 5116 is provided at the top cover rim 5112 of the top cover 511. Accordingly, the supporting shaft 530 is extended through the shaft hole 5116 and is coupled at the shaft coupler 527, such that the supporting shaft 530 forms a pivot axle of the driver assembly 520 to enable the pivotal movement of the driver assembly 520.

Furthermore, the driver assembly 520 further comprises a driver assembly pressing arm 525 downwardly extended from the driver assembly base portion 521, a driver assembly arm slot 524 provided at a side surface of the waterproof cover 101 of the waterproof assembly 100, wherein the driver assembly pressing arm 525 is engaged with the driver assembly arm slot 524. When the driver assembly 520 is moved in response to the external force, the driver assembly pressing arm 525 presses against the waterproof cover 101, such that the waterproof cover 101 is driven to move along with the driver assembly 520.

Accordingly, the waterproof assembly 100 further comprises an elastic accelerating pressing member 106 provided on a side of the waterproof cover 101 corresponding to the waterproof chamber 1000. The resetting module 400 further comprises a resetting member 410 and an elastic accelerating member 420. Preferably, the elastic accelerating member 420 is deformable in response to its thickness. It should be appreciated that the elastic accelerating member 420 can be deformed at different directions. The elastic accelerating member 420 is coupled at the power generator 200, wherein the elastic accelerating member 420 is arranged to store the elastic potential energy for accelerating the movement of the power generator 200. The resetting member 410 is arranged to store the elastic potential energy in response to the external force, wherein when the external force is released, the elastic potential energy is released from the resetting member 410 to the driver assembly 520, the power generator 200 and the elastic accelerating member 420.

Preferably, during the movement of the waterproof cover 101, the resetting member 410 and the elastic accelerating member 420 are correspondingly pressed by the elastic accelerating pressing member 106, such that the elastic accelerating member 420 is moved to drive the power generator 200 to move.

Furthermore, the bottom cover 512 further has a communication module slot 5124 and a power generator coupling slot 5125, wherein the communication module slot 5124 and the power generator coupling slot 5125 are formed at the waterproof chamber 1000. According to the preferred embodiment, a power generator mounting member 517 is provided at the bottom cover 512, wherein the power generator mounting member 517 has a plurality of power generator mounting side panels 5171 and a power generator mounting groove 5125 formed between every two adjacent power generator mounting side panels 5171. The bottom cover 512 further comprises a power generator fastener 5172 provide at each of the power generator mounting side panels 5171, wherein the power generator 200 further comprises a corresponding fastener, such as a hook, to couple with the power generator fastener 5172, such that each of the power generators 200 is securely coupled at the power generator mounting groove 5125.

A resetting member coupling shaft 518 is coupled at each of the power generator mounting side panels 5171 to retain the resetting member 410 in position. A resetting member stopper 515 is provided the bottom cover 512, wherein two ends of the resetting member 410 are coupled at the resetting member stopper 515. The elastic accelerating member 420 is supported between the resetting member 410 and the elastic accelerating pressing member 106, such that the elastic accelerating element 420 is adapted to be reset when the stored elastic potential energy is released by the resetting member 410.

It is worth mentioning that according to the preferred embodiment, the resetting member 410 is embodied as a reset torsion spring, and the elastic accelerating member 420 is embodied as a spring piece. It should be understood that the restoring element 410 and the elastic accelerating member can also be implemented in other embodiments, and it should not be limited in the present invention.

FIGS. 10 to 12 illustrates the power generator 200 and the principle of the operation of the power generator 200 for electrical generation. The power generator 200 is constructed to have a closed magnetic conductive structure for increasing the magnetic inductive density of the coil. The power generator 200 comprises a center shaft 210, a magnetic element set 220, and a coil assembly 230, wherein the magnetic element set 220 comprises a top magnetic conductive cover 221, a bottom magnetic conductive cover 222, a permanent magnet member 223, and a magnetic set fastener 224. The magnetic set fastener 224 is coupled to the top magnetic conductive cover 221 and the bottom magnetic conductive cover 222 to define a magnetic conductive cavity therebetween, wherein a relatively small gap as a magnetic gap is formed at each end of the top magnetic conductive cover 221 and the bottom magnetic conductive cover 222. Two ends of the center shaft 210, i.e. the first abutting end 211 and the second abutting end 212, are alternately abutted the magnetic gaps of the top magnetic conductive cover 221 and the bottom magnetic conductive cover 222. The permanent magnet member 223 is disposed in the magnetic conductive cavity for provide a magnetic field. Preferably, the permanent magnet member 223 is overlapped and disposed on the inner side wall of the top magnetic conductive cover 221 and the bottom magnetic conductive cover 222, such that the movement of the center shaft 210 will not blocked by the permanent magnet member 223. The permanent magnet member 223 is made of a permanent magnet material such as a magnet, an aluminum-nickel-cobalt-based permanent magnet alloy, an iron-chromium-cobalt-based permanent magnet alloy, a permanent magnet ferrite, a rare earth permanent magnet material, and a composite permanent magnet material.

The coil assembly 230 comprises a coil element 231 and a coil frame 232. The coil element 231 is disposed in the magnetic conductive cavity and encircles around the center shaft 210. In the preferred embodiment, the coil frame 232 is disposed at the center shaft 210, wherein the coil frame 232 is sleeved within the coil element 231.

The power generator 200 is assembled via the magnetic attachment method, wherein the top magnetic conductive cover 221 and the bottom magnetic conductive cover 222 are made of magnetic attractive material to enclose the permanent magnet member 223, the coil assembly 230, and the center shaft 210 therewithin so as to maximize the magnetic attractive force and to reduce the overall size of the power generator 200. The permanent magnet member 223 is sandwiched between the top magnetic conductive cover 221 and the bottom magnetic conductive cover 222, such that the top magnetic conductive cover 221 and the bottom magnetic conductive cover 222 form a two magnetic pole distribution, such as N-S pole distribution or S-N pole distribution, via the permanent magnet member 223.

FIGS. 11 and 12 illustrates the conductive direction of the magnetic line via the arrows indication. Particularly, assuming FIG. 11 as an initial state, the center shaft 210 abutted at the top magnetic conductive cover 221 and the bottom magnetic conductive cover 222 is that: the first abutting end 211 at the left side of the center shaft 210 is abutted the top magnetic conductive cover 221 while the second abutting end 212 at the right side of the center shaft 210 is abutted the bottom magnetic conductive cover 222. In other words, as shown by the arrow direction in FIG. 11, the direction of the magnetic line passes through the coil element 231 from left to right, the center shaft 210 is remained stationary, and no induced current is generated by the coil element 231.

As shown in FIG. 12, when the waterproof cover 101 of the waterproof assembly 100 is driven to move by the movement of the driver assembly 520, the elastic accelerating element 420 is driven to move at the arrow direction by the waterproof cover 101, so as to change the state of the center shaft 210 to the top magnetic conductive cover 221 and the bottom magnetic conductive cover 222. FIG. 11 illustrates an abutting state that: the first abutting end 211 at the left side of the center shaft 210 is abutted the bottom magnetic conductive cover 222 while the second abutting end 212 at the right side of the center shaft 210 is abutted the top magnetic conductive cover 221. According to the arrow direction, the direction of the magnetic line is changed to pass through the coil element 231 from right to left, which is the opposite direction of the initial state. Through the direction change of the magnetic line, the coil element 231 will generate the inducted current. It is worth mentioning that the elastic accelerating element 420 is arranged to accelerate the reciprocatingly swinging movement to increase the inducted current. It should be understood that the resetting member 410 will store the elastic potential energy during this process.

The equation for the induced electromotive force is shown as follows:

$$E = -n^* \Delta\Phi / \Delta t$$

wherein E is the induced electromotive force, n is the number of turns of the coil, and $\Delta\Phi/\Delta t$ is the rate of change of the magnetic flux.

It should be understood that when the external force applied on the driver assembly 520 is released, the resetting member 410, which is embodied as a reset torsion spring, is arranged to release the stored elastic potential energy to reset the elastic accelerating element 420 back to its original position. When the center shaft 210 is reset back to its original position, i.e. from the position in FIG. 12 to the position in FIG. 11, the direction of the magnetic line will change again, such that the coil element 231 will generate the inducted current again.

Furthermore, the power generator 200 has a power generator terminal 240 electrically connected to the communication module 300, wherein after the power generator 200 converts the mechanical form of kinetic energy into electrical energy, the electrical energy is output to the AC terminal of the communication module 300.

It is worth mentioning that the waterproof passive wireless controller further comprises a light indicator 591 for indicating status information of the waterproof passive wireless controller through the light display, wherein the light indicator 591 is supported at the waterproof chamber 1000 and is electrically connected to the communication module 300. It is worth mentioning that the waterproof cover 101 of the waterproof assembly 100 has a light transmission portion 190, wherein the light generated by the light indicator 591 is able to pass through the light transmission portion 190 without affecting the waterproof ability. The driver assembly 530 further has a light transmission hole 526 aligned with the light indicator 591, wherein the light generated by the light indicator 591 is able to pass through the light transmission hole 526.

Accordingly, the waterproof passive wireless controller of the present invention is able to provide waterproof ability and to transmit the passive wireless signals via a hand depressing actuation.

As shown in FIGS. 13 to 18, a waterproof passive wireless controller according to a second embodiment illustrates an alternative mode of the first embodiment, wherein the waterproof passive wireless controller comprises a waterproof assembly 100A, a power generator 200A, a communication module 300A, a resetting module 410A, an elastic accelerating member 420A, a bottom cover 512A, and a driver assembly 520A. The driver assembly 520A can be embodied as a top cover 511A in the embodiment of the present invention. In other words, the top cover 511A is embodied as four buttons arranged in a square shape wherein the four buttons are movable independently with each other, and are configured to drive the waterproof assembly 100A in response to an external force. Accordingly, the four buttons of the top cover 511A can be arranged in two rows and two columns configuration as one of the examples. The four buttons of the top cover 511A can be arranged side-by-side and the numbers of buttons should not be limited in the present invention. Furthermore, the top cover 512A forms different portions of the driver assembly 520A for being moved independently in response to the external force so as to drive the waterproof assembly 100A. When the waterproof assembly 100A is driven to move, elastic accelerating member 420A and the resetting member 410A are correspondingly moved, wherein the power generator 200A is actuated by the elastic accelerating member 420A to convert the mechanical form of kinetic energy into electrical energy. As a result, the communication module 300A is powered by the electrical energy and the power generator 200A is arranged to generate the electrical pulse at the same time. When the external force is released, the resetting member 410A is arranged to drive the elastic accelerating member 420A and the power generator 200A to reset. Then, the power generator 200A is arranged to generate the electrical pulse again. The waterproof assembly 100A and the bottom cover 512A form a waterproof chamber 1000A in a sealed and enclosed manner, wherein the power generator 200A, the communication module 300A, the elastic acceleration member 420A, and the resetting module 400A are sealed and supported in waterproof chamber 1000A. Therefore, the waterproof passive wireless controller of the present invention not only provides an excellent waterproof ability, but also generates different combined commands by different electrical pulses generated by the power generator 200A. Importantly, the various adjustments of the waterproof passive wireless controller can be achieved in different conditions such as humid environment.

The driver assembly 520A and the bottom cover 512A are connected by a snap connection. According to the preferred embodiment, the driver assembly fastener 5115A is provided at the inner side of the driver assembly 520A to engage with the inner side of the bottom cover 512A, such that the bottom cover 512A and the driver assembly 520A are connected each other. Via the snap connection, the driver portion 520A can be securely coupled to the bottom cover 512A to prevent the driver portion 520A from being slipped off accidentally, and to provide a quick and easy mounting and dismounting connection.

The waterproof assembly 100A comprises a waterproof cover 101A and a ring shaped waterproof element 105A, wherein the waterproof element 105A is coupled at a bottom side of the waterproof cover 101A. The waterproof element 105A is disposed in the waterproof groove 104A of the bottom cover 512A, such that the waterproof cover 101A and the waterproof element 105A of the waterproof assembly 100A and the bottom cover 512 form the waterproof chamber 1000A. Accordingly, liquid such as water cannot enter into the waterproof chamber 1000A, such that the waterproof passive wireless controller of the present invention can be normally and properly operated in a humid environment.

It is worth mentioning that the waterproof case 101A and the waterproof element 105A are preferably integrally formed to form an integrated member, to enhance the waterproof ability. Preferably, the waterproof element 105A of the waterproof assembly 100A is made of an elastic sealing material, such as a rubber or a silicone, so that the waterproof element 105A forms a water sealer being tightly and seamlessly coupled at the waterproof groove 104A due to its own elasticity, such that liquid, such as water, cannot enter into the waterproof chamber 1000A through the gap between the waterproof element 105A and the bottom cover 512A. It should be understood that the shape of the waterproof element 105A of the present invention is merely illustrated as one of the examples, wherein the shape of the waterproof element 105A can be configured to have a circular shape or a square shape, and it should not be limited in the present invention.

According to the preferred embodiment, the bottom cover 512A has a bottom cover main portion 5121A and a bottom cover side portion 5122A. The bottom cover side portion 5122A is upwardly extended from a peripheral edge of the bottom cover main portion 5121A, wherein the waterproof groove 104A is formed at the bottom cover main portion 5121A. A waterproof groove forming member 516A is formed at the bottom cover main portion 5121A, wherein the waterproof groove forming member 516A comprises an outer surrounding wall 5161A upwardly extended from the bottom cover main portion 5121A and an inner surrounding wall 5162A spaced apart from the outer surrounding wall 5161A. The waterproof groove 104A is formed between the outer surrounding wall 5161A and the inner surrounding wall 5162A.

Furthermore, the waterproof assembly 100A further has a mounting hole 107A and a fixing hole 108A. The bottom cover 512A has a bottom cover mounting hole 587A corresponding to the mounting hole 107A of the waterproof assembly 100A, and a bottom cover fixing hole 588A corresponding to the fixing hole 108A of the waterproof assembly 100A. The mounting hole 107A of the waterproof assembly 100A and the bottom cover mounting hole 587A of the bottom cover 512A are engaged with each other via a fastener such as a screw. The fixing hole 108A of the waterproof assembly 100A and the bottom cover fixing hole 588A of the bottom cover 512A are also engaged with each other by another fastener such as a screw. Therefore, the waterproof assembly 100A and the bottom cover 512A can be sealingly connected with each other, and the power generator 200A can be sealed and disposed in the waterproof chamber 1000A.

The waterproof cover 101A of the waterproof assembly 100A further has at least a waterproof movable portion 110A, a light retention portion 120A preferably having a ring shape, a waterproof cover main portion 130A, and a shaft supporting portion 140A. The shape and number of the waterproof active portion 110A match with the shape and number of the driver assembly 520A, wherein the waterproof active portion 110A is coupled at the waterproof case main portion 130A. The bottom surface of each of the waterproof movable portions 110A can press against each of the elastic accelerating members 420A. In other words, when each of the driver assemblies 520A is driven to move in response to the external force, the driver assembly 520A is arranged to drive the corresponding waterproof movable portion 110A of the waterproof cover 101A of the waterproof assembly 100A to move, such that the bottom surface of each of the waterproof movable portions 110A can press against each of the elastic accelerating members 420A. Particularly, the waterproof movable portion 110A further has a plurality of waterproof cover protrusions 111A provided at the bottom surface thereof. In other words, the waterproof cover protrusions 111A are protruded from the bottom surface of the waterproof movable portion 110A to press against the elastic accelerating member 420A, such that the elastic accelerating member 420A is arranged to drive the power generator 200A to convert the mechanical energy into electrical energy.

It is worth mentioning that the bottom cover 512A further comprises a light indicator 591A being activated by the driver assembly 520A. For example, when the driver assembly 520A is moved or pressed by the external force to actuate the power generator 200A for generating electric energy, the light indicator 591A is activated to emit light as a feedback. The function of the light indicator 591A is merely an example. Furthermore, the waterproof cover 101A of the waterproof assembly 100A further has an indicator hole 190A located corresponding to the location of the light indicator 591A at the bottom cover 512A. The light retention portion 120A is upwardly protruded around the indicator hole 190A, wherein he light retention portion 120A is tightly coupled to the driver assembly 520A. When the waterproof assembly 100A and the bottom cover 512A are coupled with each other, water cannot enter into the waterproof chamber 1000A through the indicator hole 190A, such that the waterproof passive wireless controller of the present invention can provide excellent waterproof ability.

Furthermore, the waterproof cover 101A of the waterproof assembly 100A further comprises at least a supporting shaft 530A provided at the shaft supporting portion 140A. The driver assembly 520A comprises a corresponding shaft fastener 527A, wherein the supporting shaft 530A is coupled with the shaft fastener 527A, such that the supporting shaft 530A forms a pivot axle for enabling the driver assembly 520A to move pivotally. According to the preferred embodiment, the waterproof cover 101A provides eight supporting shafts 530A, wherein four of the supporting shafts 530A are coupled at the waterproof cover main portion 130A, and four of the supporting shafts 530A are coupled at the support shaft support portion 140A. Correspondingly, eight shaft fasteners 527A are spacedly provided at the driver assembly 520A, such that the driver assembly 520A is movable via the spaces between the buttons of the driver assembly 520A and the space between the driver assembly 520A and the waterproof cover 101A. It should be understood that the number and arrangement of the support shaft support portion 140A, the shaft fasteners 527A and the supporting shafts 530A are merely illustrated as one of the examples, and it should not be limited in the present invention.

It is worth mentioning that in this embodiment, the driver assembly 520A comprises four press buttons, wherein each of the press buttons is pivotally connected similar to the pivot configuration of the shaft fastener 527A, such that one or more of the press buttons are able to be pressed or actuated at the same time and reset back to their positions at the same time to generate the combined command. The waterproof passive wireless controller of the present invention can be defined as a reciprocating type. However, it should be understood that the number of press buttons of the driver assembly 520A is illustrated as one of the examples, and it should not be limited in the present invention. When the driver assembly 520A is moved in response to the external force, the waterproof movable portion 110A of the waterproof cover 101A of the waterproof assembly 100A is pressed by the driver assembly pressing arm 525A. The elastic accelerating member 420A is pressed by the bottom side of the waterproof movable 110A, such that the elastic accelerating member 420A is driven to move. One end of the elastic accelerating member 420A is coupled to the power generator 200A for storing the elastic potential energy to accelerate the movement of the power generator 200A. The other end of the elastic accelerating member 420A is arranged to press against the resetting member 410A. The resetting member 410A is arranged to store the elastic potential energy during the application of the external force. When the external force is release, the elastic potential energy is released by the resetting member 410A to reset the driver assembly 520A, the power generator 200A and the elastic accelerating member 420A.

Preferably, the waterproof assembly 100A is made of hard plastic and soft rubber. Preferably, the waterproof assembly 100A is made by integrally injection molded. For example, the waterproof assembly 100A is preferably made of hard plastic as a support and retention portion, such as the waterproof cover main portion 130A for forming the mounting hole 107A and the fixing hole 108A, the shaft supporting portion 140A, and the supporting shaft 530A. The waterproof assembly 100A is preferably made of soft plastic as a movable and waterproof portion, such as the waterproof movable portion 110A, light retention portion 120A and the waterproof element 105A. In addition, in other embodiments, the entire waterproof assembly 100A is made of a rubber material as a support and incorporate the shaft fastener 527A and the supporting shaft 530A to connect the driver assembly 200A at the bottom cover 512A. It should be understood that the material of the waterproof assembly 100A is merely illustrated as one of the examples, and it should not be limited in the present invention.

Furthermore, the bottom cover 512A further has a power generator mounting groove 5125A, and comprises a power generator mounting member 517A. The power generator mounting member 517A comprises a plurality of power generator mounting side panels 5171A to define a power generator mounting groove 5125A between every two of the adjacent power generator mounting side panels 5171A. The power generator mounting member 517A further comprises a plurality of power generator mounting fasteners 5172A coupled at the power generator mounting side panels 5171A respectively, such that the power generators 200A are respectively mounted in the power generator mounting groove 5125A.

According to the preferred embodiment, the resetting member 410A is implemented as a reset torsion spring, and the elastic accelerating member 420A is implemented as a spring piece. It should be understood that the resetting member 410A and the elastic accelerating member 420A can also be implemented as different spring element in other embodiments, and it should not be limited in the present invention.

The bottom cover 512A further comprises a reset component limiting panel extending therefrom, wherein the reset component limiting panel comprises a resetting fixing shaft 518A for retaining the resetting member 410A. The bottom cover 512A further comprises a resetting member stopper, wherein two ends of the resetting member 410A are coupled to the reset member stopper. The elastic accelerating member 420A is supported between the resetting member 410A and the waterproof cover protrusions 111A, such that the elastic accelerating member 420 can be reset when the stored elastic potential energy is released by the resetting member 410A.

Furthermore, the power generator terminal 240A of the power generator 200A is abutted and electrically connected to the communication module 300A. After converting mechanical form of kinetic energy into electrical energy, the power generator 200A outputs electrical energy to the AC terminal of the communication module 300. In other words, the power generator 200A of the waterproof passive wireless controller of the present embodiment has the same structure as the power generator 200 of the first preferred embodiment. It can be understood that in other modified embodiments, the power generator 200A may be configured to other structure that generates electrical energy using conventional mechanical energy. It could be incorporated with other reasonable structures and it should not be limited in the present invention. It is worth mentioning that the position and the number of the power generator 200A can be arbitrarily arranged according to the actual need or application to enhance the economical value of the waterproof passive wireless controller of the present invention.

As shown in FIGS. 19 to 26, a waterproof passive wireless controller according to a third embodiment illustrates an alternative mode of the above embodiments, wherein the waterproof passive wireless controller comprises a waterproof assembly 100B, a power generator 200B, a communication module 300B, a resetting module 400B, a housing 510B, a lever 600B and a driver assembly 520B. The housing 510B comprises a top cover 511B and a bottom cover 512B, wherein the waterproof assembly 100B and the bottom cover 512B of the housing 510B form a waterproof chamber 1000B in a sealed and enclosed manner. The power generator 200B, the communication module 300B and the resetting module 400B are supported within the waterproof chamber 1000B. The waterproof assembly 100B and the top cover 511B of the housing 510B form a movable chamber 2000B for communicating with an external of the housing 510B. The top cover 511B has a driver assembly hole 5110B for mounting the driver assembly 520B. Accordingly, the driver assembly 520B is implemented as a plurality of movable buttons independently disposed on the top cover 511B, wherein one end of each movable button is movably extended in the movable chamber 2000B in response to an external force. In response to an external force, the driver assembly 520B is arranged to press and actuate the waterproof assembly 100B, wherein the waterproof assembly 100B is arranged to further press against the lever 600B in the waterproof chamber 1000B, such that the resetting module 400B is driven to move by the lever 600B. The resetting module 400B is arranged to drive and activate the power generator 200B to convert mechanical form of kinetic energy into electrical energy in order to supply the electrical power to the communication module 300B. After the power generator 200B generates the electrical energy, the lever 600B is pre-pressed to generate a command or a logic command via the electrical level.

Particularly, the waterproof component 100B comprises a waterproof cover 101B and a waterproof wall 105B. The bottom cover 512B has a bottom cover main portion 5121B and a bottom cover side portion 5122B. The bottom cover side portion 5122B is extended upwardly from a peripheral edge of the bottom cover main portion 5121B. The waterproof wall 105B is coupled a the bottom cover main portion 5121B.

According to this embodiment, the top cover 511B is sleeved around the bottom cover 512B and fastened to a bottom cover fastener 5123B of the bottom cover 512B. The bottom cover fastener 5123B can be disposed on an outer sidewall of the bottom cover side portion 5122B. Alternatively, the bottom cover fastener 5123B may also be disposed on the inner side wall of the bottom cover side portion 5122B in other embodiments. Likewise, the bottom cover fastener 5123B can also be disposed in the bottom cover main portion 5121B in other embodiments as long as the top cover 511B and the bottom cover 512B can be detachably connected with each other in a stable manner and does not affect the sealing ability of the waterproof cavity 1000B. It should not be limited in the present invention.

According to the preferred embodiment, the waterproof cover 101B of the waterproof assembly 100B is made of a soft rubber material and is disposed on the waterproof wall 105B of the bottom cover 512B. The top cover 511B is pressed against the periphery of the waterproof cover 101B, wherein the top cover 511B is connected, preferably by snap-fitted, to the bottom cover fastener 5123B of the bottom cover 512B.

The waterproof chamber 1000B is formed between the waterproof cover 101B of the waterproof assembly 100B and the bottom cover 512B for preventing rainwater and dust from entering into the waterproof chamber 1000B, so as to achieve the waterproof and dustproof effects.

It is worth mentioning that according to the preferred embodiment, the driver assembly 520B is implemented as a button disposed on the waterproof cover 101B of the waterproof assembly 100B. The waterproof cover 101B of the waterproof assembly 100B is pressed against the lever 600B for functional operation with waterproof and dustproof ability.

The resetting module 400B further comprises a resetting member 410B and an elastic accelerating member 420B. The elastic accelerating member 420B is coupled to the power generator 200B for storing the elastic potential energy in order to accelerate the movement of the power generator 200B. The resetting member 410B is arranged to store the elastic potential energy in response to the external force. When the external force is released, the driver assembly 520B, the power generator 200B, and the elastic accelerating member 420B are reset to their original positions. When the waterproof cover 101B is moved, the elastic accelerating member pressing member 106B is arranged to press against the elastic accelerating member 420B, such that the elastic accelerating member 420B is driven to actuate the power generator 200B.

It should be understood that in this embodiment, the driver assembly 520B is implemented as six press buttons configured side-by-side in a two-row array. The number and shape of the buttons are merely illustrated as one of the examples, and it should not be limited in the present invention.

According to the preferred embodiment, the power generating device mounting member 517B is coupled at the bottom cover main portion 5121B of the bottom cover 512B. The power generator mounting member 517B comprises a plurality of power generator mounting side panels 5171B to define a power generator mounting groove 5125B between every two of the adjacent power generator mounting side panels 5171B. The power generator mounting member 517B further comprises a plurality of power generator mounting fasteners 5172B coupled at the power generator mounting side panels 5171B respectively. At least a fastener is provided at an external of the power generator 200B, wherein the power generators 200B are respectively mounted in the power generator mounting groove 5125B. A fixing shaft 518B is further provided to couple with the power generator mounting side panel 5171B for retaining the resetting member 410B. The elastic accelerating member 420B is disposed between the resetting member 410B and the lever 600B, such that the elastic accelerating member 420B can be reset when the stored elastic potential energy is released by the resetting member 410B.

Furthermore, the lever 600B comprises a first lever side wing 610B, a second lever side wing 620B, a lever body 630B, and a lever point 640B. The first lever side wing 610B and the second lever side wing 620B are sidewardly and symmetrically extended at two sides of the lever body 630B respectively. Preferably, along the symmetrical axis of the lever body 630B, the bottom cover 512B comprises a lever stopper 5124B to stop the movement of the lever 600B. The lever stopper 5124B is coupled at the lever 600B as a pivot point for enabling the pivotal movement of the lever 600B. The lever point 640B is defined on a surface of the lever body 630B facing toward the elastic accelerating member 420B. The lever point 640B can be integrally protruded from the lever body 630B, or can be connected to the lever body 630B after it is formed. It should not be limited in the present invention.

Figure 23:
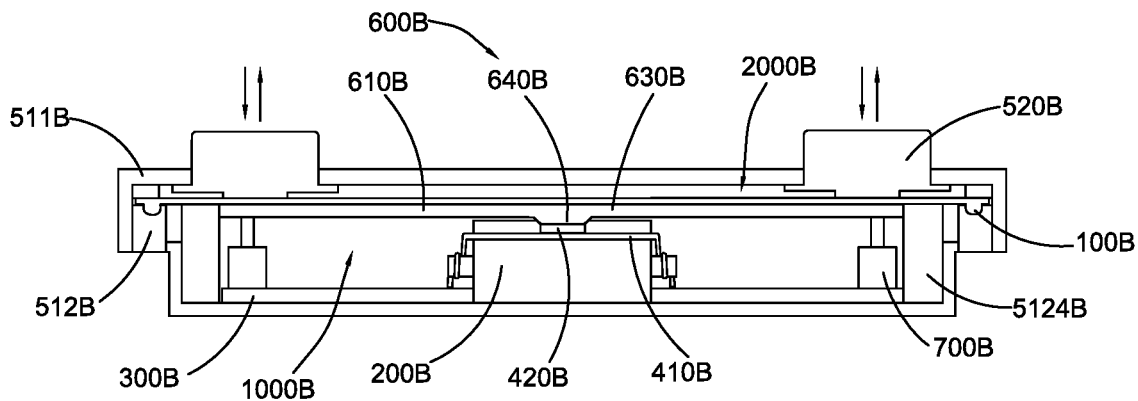
FIG. 23 is a sectional view of the waterproof passive wireless controller at the normal position according to the above third embodiment of the present invention.
Figure 24:
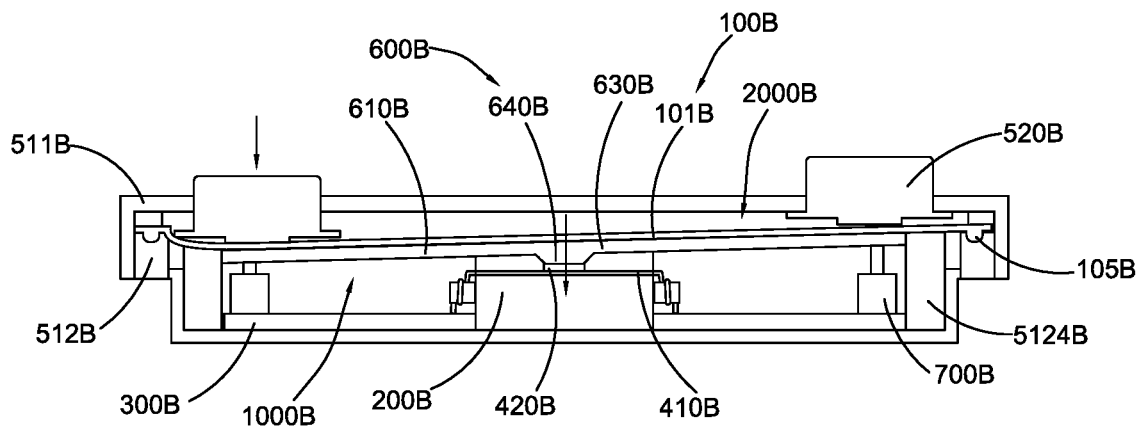
FIG. 24 is a sectional view of the waterproof passive wireless controller at the actuation position according to the above third embodiment of the present invention.

FIGS. 23 and 24 illustrate the principle of waterproofing for the embodiment of the present invention. As shown in FIG. 23, the waterproof cover 101B is disposed on a top side of the bottom cover 512B or a waterproof wall surface. The edge of the top cover 511B and the edge of the waterproof cover 101B are pressed together, such that the waterproof cavity 1000B is sealed and formed between the waterproof cover 101B and the bottom cover 512B. A switch 700B is electrically connected to the power generator 200B, the resetting member 400B, the communication module 300B. The lever 600B is disposed between the waterproof cover 101B and the bottom cover 512B, wherein the lever 600B disposed in the waterproof chamber 1000B. The driver assembly 520B is implemented as a button disposed on the other side of the waterproof cover 101B, and is received in the movable chamber 2000B. The driver assembly 520B is implemented as a button being actuated to move in response to the external force.

It is worth mentioning that the driver assembly 520B is implemented as a press button being separated by the waterproof cover 101B to press or actuate the lever 600B in the waterproof chamber 1000B. The lever 600B is driven to move for actuating the power generator 200B to electricity generation, such that the communication module 300B can emit a radio signal in any environment, such as the communication module 300B is immersed in water or the like.

It is worth mentioning that the power generator 200B of the present invention can be a mechanical power generating device for magnetoelectric conversion, or a piezoelectric element for piezoelectric conversion. When the piezoelectric element is employed, the piezoelectric element is placed below the lever point 640B as shown in FIG. 23, such that the lever point 640B is arranged to press the piezoelectric element for electricity generation.

As shown in FIG. 24, when any one of the buttons of the driver assembly 520B is pressed or actuated, the waterproof cover 101B of the waterproof component 100B is elastically deformed, and the lever 600B starts to move downwardly as shown in the figure. The lever 600B is arranged to firstly press against the switch 700B under the driver assembly 520B for being electrified. Then, when the lever 600B is continuously moved downwardly to descend, and the downward moving amplitude of the lever point 640B becomes larger. The lever point 640B is arranged to downwardly press the elastic accelerating member 410B at a predetermined position. The elastic accelerating member 410B is arranged to accelerate the movement of the iron core of the power generator 200B, such that the power generator 200B is actuated for electricity generation. Furthermore, when the electrical power is supplied to the communication module 300B, since the switch 700B is previously switched on, an I/O interface of an encoder of the communication module 300B is turned on. Therefore, after the electrical power is supplied to the communication module 300B, the communication module 300B is arranged to generate the encoded wireless signal corresponding to the pre-electrified switch 700B. Furthermore, when the external force is released from the button of the driver assembly 520B, the resetting member 410B is reset and moved back to its original position, such that the power generator 200B is arranged to generate the electrical energy again. As a result, the communication module 300B is arranged to generate the wireless signal again. Then, the button of the driver assembly 520B, the lever 600B, the waterproof cover 101B of the waterproof assembly 100B, and the switch 700B are all reset to move back to their original position by the resetting member 410B, so as to return to the initial state.

Figure 25:
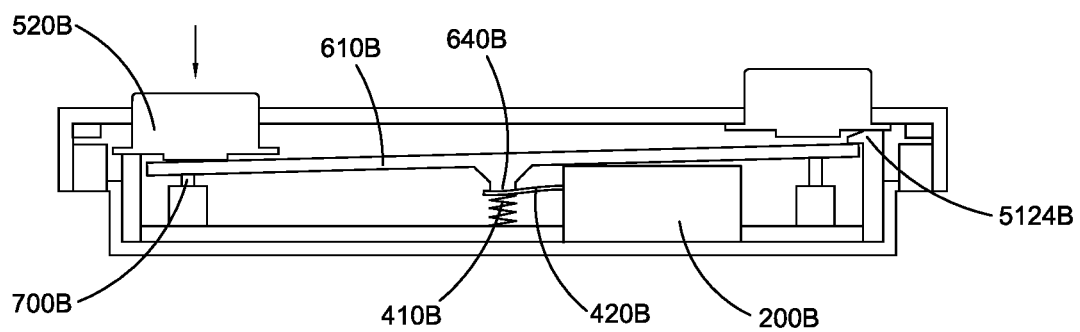
FIG. 25 is a sectional view of the waterproof passive wireless controller according to the above third embodiment of the present invention, illustrating the resilient element.

FIG. 25 illustrates a simplified operation of the lever 600B, wherein some components are omitted in FIG. 25 for easily understanding of the movement of the lever 600B. The resetting member 410B is embodied as a spring. Specifically, when the button of the driver assembly 520B is not pressed or actuated, two ends of the lever 600B, i.e. the first lever side wing 610B and the second lever side wing 620B, are restricted and limited by the lever stopper 5124B. The mid-portion of the lever 600B, i.e. the lever body 630B, is pushed upwardly by the spring of the resetting member 410B so as to maintain the lever 600B in a balancing manner.

When the external force is applied on the button of the driver assembly 520B, the power generator 200B is actuated for electrical generation by the lever 600 by the steps of: pressing downward the button of the driver assembly 520B is in the direction as shown in FIG. 25; moving down the lever 600B in a synchronized manner; pre-electrifying the switch 700B to be switched on; and downwardly moving the lever point 640B to press against the elastic accelerating member 420B, such that the power generator 200B is actuated for electricity generation.

Figure 26:
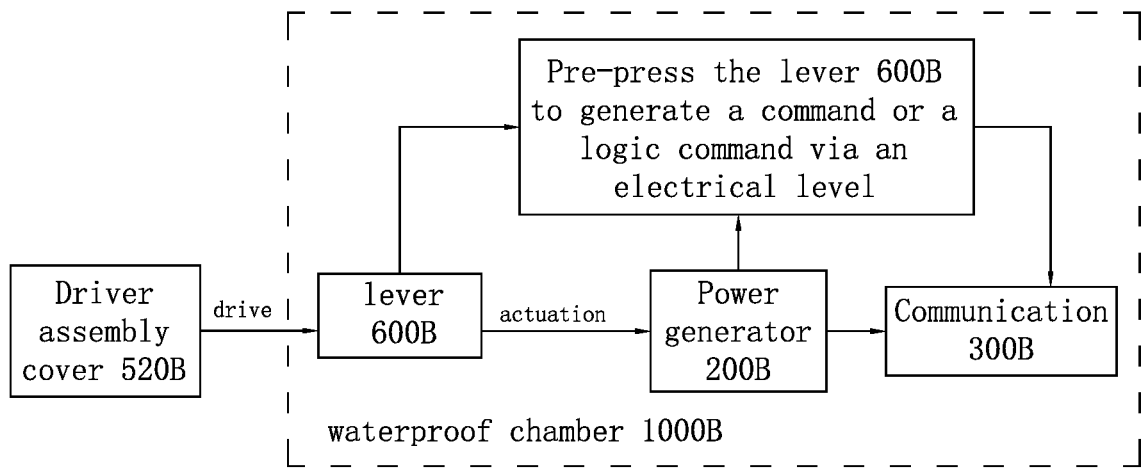
FIG. 26 is a block diagram of the waterproof passive wireless controller according to the above third embodiment of the present invention.

As shown in FIG. 26, when the driver assembly 520B is pressed or pushed by the external force, the moving displacement of the driver assembly 520B being pressed or pushed will generate the mechanical energy. The driver assembly 520B is arranged to push the lever 600B, wherein the power generator 200B is actuated by the lever 600B to convert the mechanical energy into electric energy so as to supply the electric power to the communication module 300B. At the same time, the preload of the lever 600B is arranged to generate a control command or generates a control command through a logic level.

Therefore, the present invention can be commonly used as a waterproof passive wireless controller in a bathroom, a kitchen, an outdoor, and the like, such as water and rain forests, such that the present invention is safe and more convenient for use in different applications.

Accordingly, the present invention further provides a waterproof passive wireless control system which incorporates the waterproof passive wireless controller as disclosed above with an instruction executor, wherein the instruction executor is arranged to receive the waterproof passive wireless control commands and is arranged to control functions of other functional devices such as smart home facility.

Figure 27:
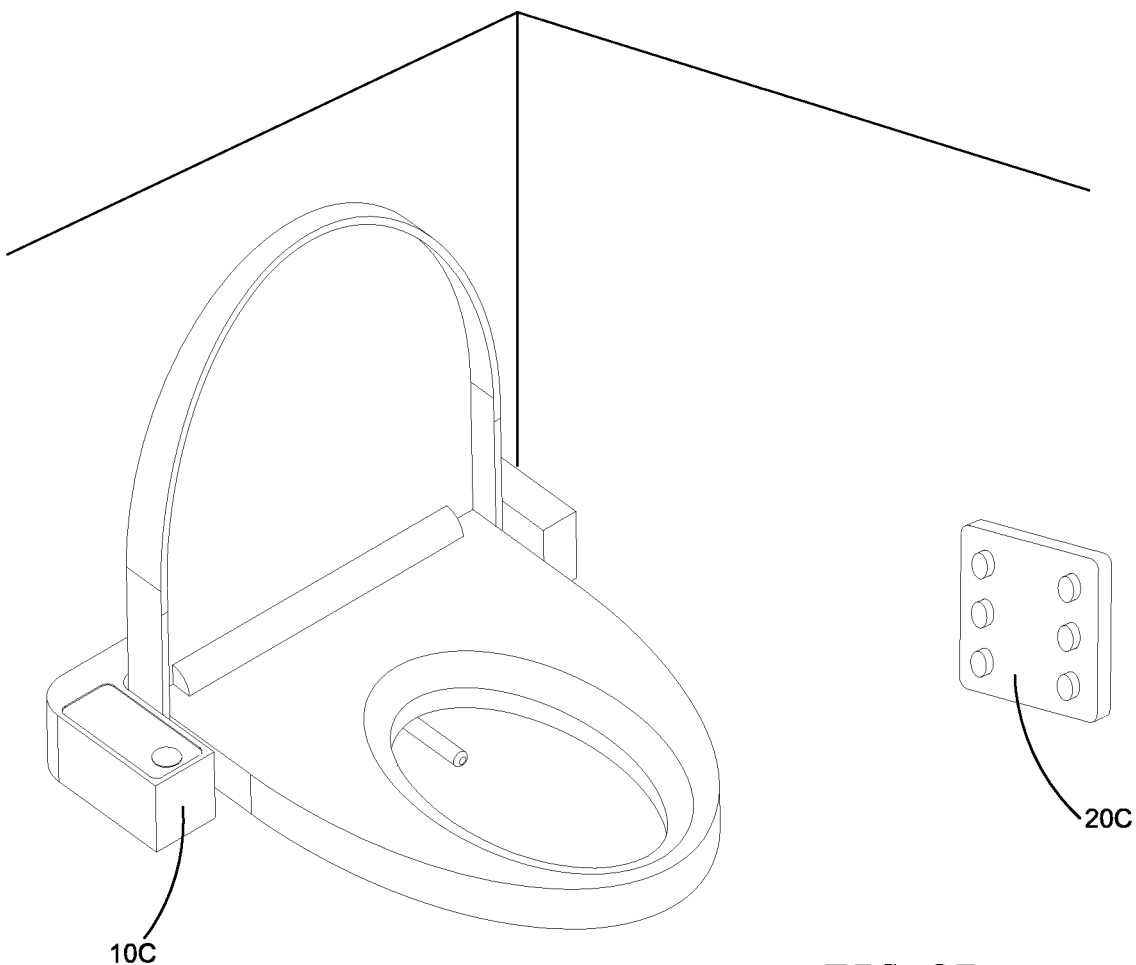
FIG. 27 illustrating an application of the waterproof passive wireless controller according to the above embodiments of the present invention, illustrating the waterproof passive wireless controller being used in a toilet system.
Figure 28:
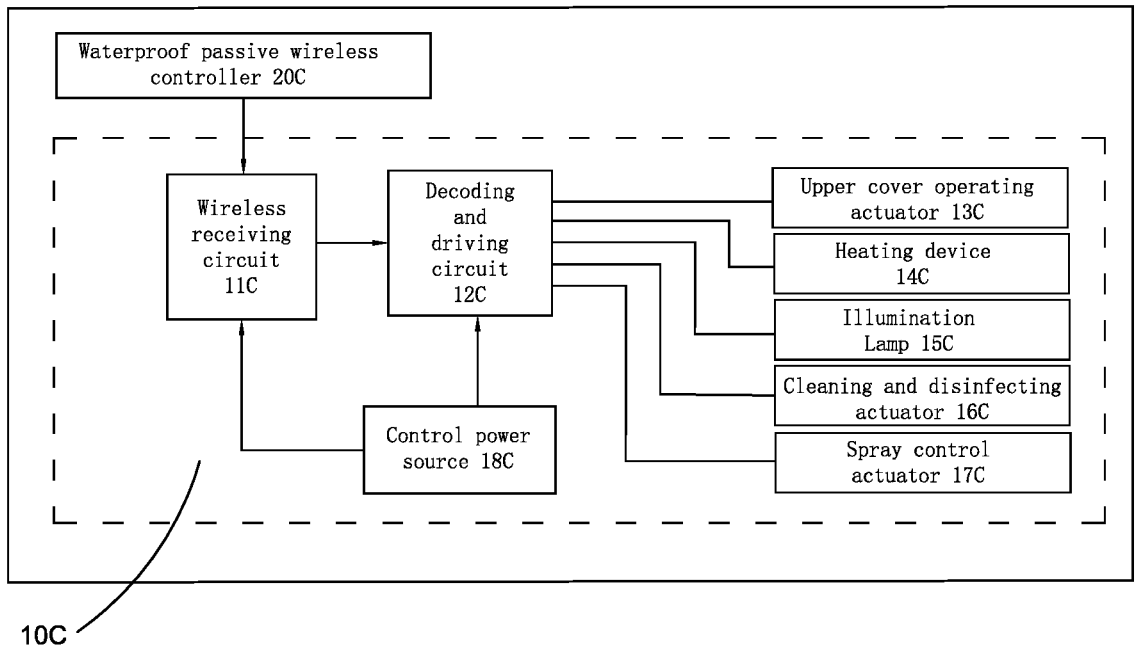
FIG. 28 is a block diagram of a system incorporating the waterproof passive wireless controller according to the above embodiments of the present invention.

As shown in FIGS. 27 to 28, the waterproof passive wireless controller of the present invention is used in a smart toilet, wherein the waterproof passive wireless controller in other embodiments can also be used in a smart toilet cover. The waterproof passive wireless controller can control the smart toilet in a humid environment such as a bathroom. For example, the waterproof passive wireless controller is able to control the temperature of the toilet seat, to control the electric cleaning head for performing different water spray cleaning operations, to control the automatic opening and closing of the toilet cover, and to control the activation of the ventilation fan.

Particularly, as shown in FIG. 27, the smart toilet comprises a toilet command actuator 10C and a waterproof passive wireless controller 20C, wherein the waterproof passive wireless controller 20C is communicatively coupled to the toilet command actuator 10C. The toilet command actuator 10C is configured to perform functions such as heating the toilet seat of the smart toilet, controlling a water spray cleaning operation with different water powers, automatically opening and closing the toilet cover, and activating the ventilation fan. The waterproof passive wireless controller 20C completes various functional controls by the toilet command actuator 10C through a communicatively connection with the toilet command actuator 10C, such that the toilet command actuator 10C completes each operation according to a preset function. The waterproof passive wireless controller 20C does not need to install an additional power source, wherein the waterproof passive wireless controller 20C itself is arranged to convert the electric energy and supply the electrical power so as to control the toilet command actuator 10C for different operations.

FIG. 28 illustrates a block diagram of the smart toilet, illustrating the various components of the toilet command actuator 10C and the connection between the toilet command actuator 10C and the waterproof passive wireless controller 20C. The waterproof passive wireless controller 20C is arranged to convert the mechanical energy into electrical energy to power itself and to control the toilet command actuator 10C. When the external force, such as a pressing force or a pushing force, is applied on the waterproof passive wireless controller 20C, the waterproof passive wireless controller 20C is actuated to convert the mechanical energy into electrical energy to power itself. When the communication module of the waterproof passive wireless controller 20C is electrified, the control command is generated and is wirelessly sent to the wireless receiving circuit 11C of the toilet command actuator 10C. After encoding the control command by the decoding and driving circuit 12C of the toilet command actuator 10C, the toilet command actuator 10C is activated for completing different operations for the smart toilet.

The toilet command actuator 10C further comprises a control power source 18C for supplying electrical power to the wireless receiving circuit 11C and the decoding and driving circuit 12C. The toilet command actuator 10C further comprises an upper cover operating actuator 13C, a heating device 14C, an illumination lamp 15C, a cleaning and disinfecting actuator 16C, and a spray control actuator 17C. The upper cover operating actuator 13C is coupled at the toilet cover to actuate the toilet cover between its opening and closing positions. The heating device 14C is arranged for controlling the temperature of the toilet seat. The illumination lamp 15C is used for illumination of the toilet area. The cleaning and disinfecting actuator 16C is arranged for cleaning and disinfecting the toilet. The spray control actuator 17C is arranged for spraying liquid or mist in the toilet. It should be understood that the upper cover operating actuator 13C, the heating device 14C, the illumination lamp 15C, the cleaning and disinfecting actuator 16C, and the spray control actuator 17C are illustrated as one of the examples. In other embodiments, the toilet command actuator 10C is able to incorporate with different devices in the smart toilet, and it should not be limited in the present invention.

It is worth mentioning that even though FIG. 27 illustrates the structure and power generation principle of the waterproof passive wireless controller 20C according to the third embodiment of the present invention, the same structure and power generation principle can be applied to the waterproof passive wireless controller 20C according to the first and second embodiments of the present invention. It should not be limited in the present invention.

Figure 29:
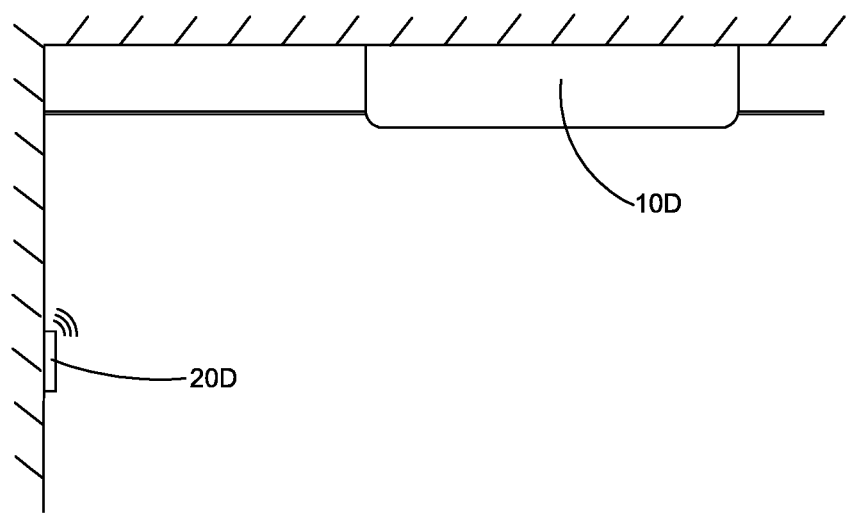
FIG. 29 illustrating another application of the waterproof passive wireless controller according to the above embodiments of the present invention, illustrating the waterproof passive wireless controller being used in a showering system.
Figure 30:
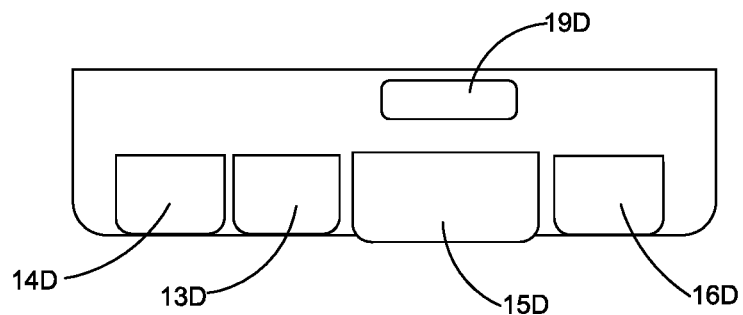
FIG. 30 illustrates the showering system with the waterproof passive wireless controller according to the above embodiments of the present invention.
Figure 31:
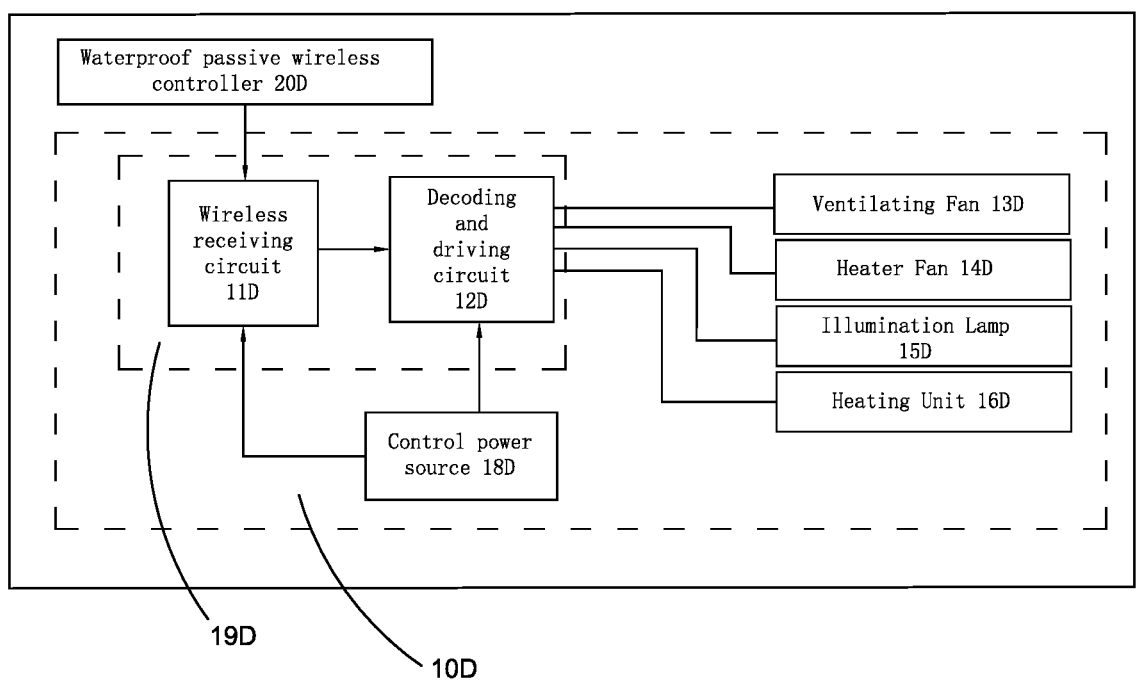
FIG. 31 is a block diagram of the showering system incorporating the waterproof passive wireless controller according to the above embodiments of the present invention.

FIGS. 29 to 31 illustrate the waterproof passive wireless controller of the present invention being used in a bathroom system in a bathroom.

As shown in FIG. 29, the bathroom system comprises a bathroom command actuator 10D and a waterproof passive wireless controller 20D, wherein the waterproof passive wireless controller 20D is communicatively linked to the bathroom command actuator 10D. The bathroom command actuator 10D is configured to operate different functions, such as switching on-and-off a bathroom heater, a ventilating fan, an illumination lamp, a water heater, and the like of the bath devices. Through the communicatively connection with the bathroom command actuator 10D, the waterproof passive wireless controller 20D is arranged to send out different command signals to operatively control the bathroom command actuator 10D, such that the bathroom command actuator 10D will completes each operation according to a preset function. It is worth mentioning that the waterproof passive wireless controller 20D does not require any installation of an additional power source, wherein the waterproof passive wireless controller 20D is arranged to converts the electric energy by itself as the supply power, in order to control the bathroom command actuator 10D to implement various functions.

As shown in FIG. 30, the bathroom command actuator 10D comprises a control circuit board 19D, a heater fan 14D, a ventilating fan 13D, an illuminating lamp 15D, and a heating unit 16D. When the waterproof passive wireless controller 20D wirelessly sends out the command signal to the control circuit board 19D, the control circuit board 19D is arranged to activate and operate the heater fan 14D, the ventilating fan 13D, the illumination lamp 15D, and the heating unit 16D according to the control instruction, such as activation operation or deactivation operation. Accordingly, the heater fan 14D is arranged to provide warm air, the ventilation fan 13D is arranged to provide air circulation of air inside and outside the bathroom, the illumination lamp 15D is arranged for illumination, the heating unit 16D is arranged to provide a heating function, such as water heating function and/or toilet seat warming function, and the like. It should be understood that the heater fan 14D, the ventilating fan 13D, the illuminating lamp 15D, and the heating unit 16D are merely one of the examples. In other embodiments, the bath device may provide different functions, and it should not be limited in the present invention.

FIG. 31 illustrates a block diagram of the bathroom system to show the various components of the bathroom command actuator 10D being connected to the waterproof passive wireless controller 20D. Accordingly, the waterproof passive wireless controller 20D is arranged to convert mechanical energy into electrical energy to power itself in order to control the bathroom command actuator 10D. Particularly, when an external force is applied, such as pressed or pushed, on the waterproof passive wireless controller 20D, the waterproof passive wireless controller 20D is arranged to convert the external force as the mechanical energy into electrical energy for supplying power to itself. When the communication module of the waterproof passive wireless controller 20D is powered or electrified, the waterproof passive wireless controller 20D is arranged to wirelessly send the control command to the wireless receiving circuit 11D of the control circuit board 19D of the bathroom command actuator 10D. Then, the decoding and driving circuit 12D of the control board 19D of the bathroom command actuator 10D is arranged to decode and drive the bathroom command actuator 10D to activate or operate different functions of the bath device. The bathroom command actuator 10D further comprises a control power source 18D for supplying power to the wireless receiving circuit 11D and the decoding and driving circuit 12D of the control circuit board 19D.

It is worth mentioning that the structure and power generation principles of the waterproof passive wireless controller in the above three embodiments of the present invention can also be applied to the waterproof passive wireless controller 20D of the bathroom system.

Figure 32:
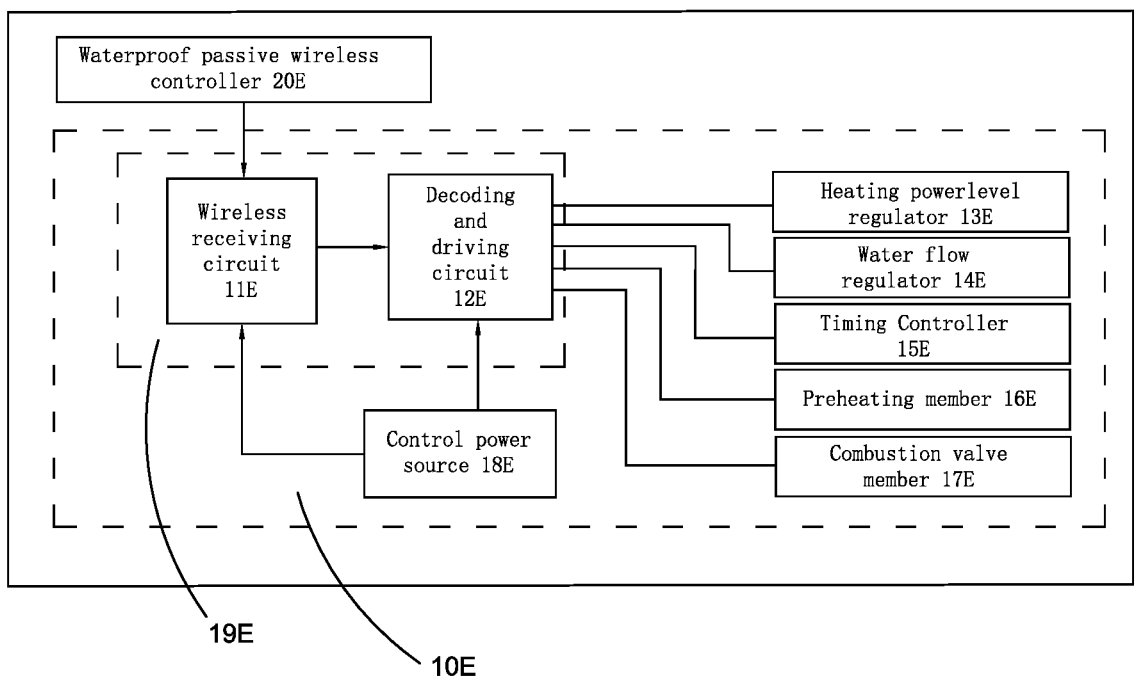
FIG. 32 is a block diagram of the modified showering system incorporating the waterproof passive wireless controller according to the above embodiments of the present invention.

Similarly, FIG. 32 illustrates the waterproof passive wireless controller of the present invention being used for a water heater device in a bathroom.

As shown in FIG. 32, the water heater apparatus comprises a water heater command actuator 10E and a waterproof passive wireless controller 20E, wherein the waterproof passive wireless controller 20E is communicatively linked to the water heater command actuator 10E. The water heater command actuator 10E is configured to activate or operate different functions such as heating level regulation, water flow adjustment, timing control, preheating operation, and gas valve control of the water heater apparatus. Through the communicatively connection with the water heater command actuator 10E, the waterproof passive wireless controller 20E is arranged to send out different command signals to operatively control the water heater command actuator 10E, such that the water heater command actuator 10E will completes each operation according to a preset function. It is worth mentioning that the waterproof passive wireless controller 20E does not require any installation of an additional power source, wherein the waterproof passive wireless controller 20E is arranged to converts the electric energy by itself as the supply power, in order to control the water heater command actuator 10E to implement various functions.

As shown in FIG. 32, the water heater command actuator 10E comprises a control circuit board 19E, a heating power level regulator 13E, a water flow regulator 14E, a timing controller 15E, a preheating member 16E, and a combustion valve member 17E. When the waterproof passive wireless controller 20E wirelessly sends out the command signal to the control circuit board 19E, the control circuit board 19E is arranged to activate and operate the heating power level regulator 13E, the water flow regulator 14E, the timing controller 15E, the preheating member 16E, and the combustion valve member 17E according to the control instruction, such as activation operation or deactivation operation. The heating power level regulator 13E is arranged to adjust the heating power, the water flow regulator 14E is arranged to regulate the flow of water, the timing controller 15E is arranged for timing control, the preheating member 16E is arranged to provide a preheating function, and the combustion valve member 17E is arranged to control the gas valve, etc. It should be understood that the heating power level regulator 13E, the water flow regulator 14E, the timing controller 15E, the preheating member 16E, and the combustion valve member 17E are merely one of the examples. In other embodiments, the bath device may provide different functions, and it should not be limited in the present invention.

FIG. 32 illustrates a block diagram of the bathroom system to show the various components of the bathroom command actuator 10E being connected to the waterproof passive wireless controller 20E. Accordingly, the waterproof passive wireless controller 20E is arranged to convert mechanical energy into electrical energy to power itself in order to control the bathroom command actuator 10E. Particularly, when an external force is applied, such as pressed or pushed, on the waterproof passive wireless controller 20E, the waterproof passive wireless controller 20E is arranged to convert the external force as the mechanical energy into electrical energy for supplying power to itself. When the communication module of the waterproof passive wireless controller 20E is powered or electrified, the waterproof passive wireless controller 20E is arranged to wirelessly send the control command to the wireless receiving circuit 11E of the control circuit board 19E of the bathroom command actuator 10E. Then, the decoding and driving circuit 12E of the control board 19E of the bathroom command actuator 10E is arranged to decode and drive the bathroom command actuator 10E to activate or operate different functions of the bath device. The bathroom command actuator 10E further comprises a control power source 18E for supplying power to the wireless receiving circuit 11E and the decoding and driving circuit 12E of the control circuit board 19E.

It is worth mentioning that the structure and power generation principles of the waterproof passive wireless controller in the above three embodiments of the present invention can also be applied to the waterproof passive wireless controller 20E of the bathroom system.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A waterproof passive wireless controller, comprising:
a driver assembly adapted for being actuated in response to an external force;
a waterproof assembly comprising a waterproof cover and a waterproof wall extended from a peripheral edge of said waterproof cover;
a housing coupled to said waterproof assembly to form a waterproof chamber therebetween;
a power generator sealed and supported within said waterproof chamber;
a communication module sealed and supported within said waterproof chamber and electrically connected to said power generator, wherein when the external force is applied on said driver assembly, wherein said power generator is actuated by said driver assembly for converting a mechanical energy of the external force into an electrical energy to power said communication module, such that said communicated module is activated for generating a control signal; and
a lever, a resetting member, an elastic accelerating member, and a micro switch disposed in said waterproof chamber, wherein said micro switch is electrically connected to said communication module in order to activate communication module, wherein said driver assembly is separated from said lever by said waterproof cover in a waterproof manner and is pressed by said lever, wherein said lever is pressed against said elastic accelerating member, wherein said elastic accelerating member is coupled to said power generator, wherein said resetting member is arranged to reset said driver assembly, said lever, said power generator, and said elastic accelerating member back to original positions thereof.

2. The waterproof passive wireless controller, as recited in claim 1, wherein said lever comprises at least a first lever side wing, at least a second lever side wing, at least a lever body, and at least a lever point, wherein said first lever side wing and said second lever side wing are sidewardly and symmetrically extended at two sides of said lever body respectively, wherein said lever point is upwardly protruded from said lever body, wherein said driver assembly is separated from said lever body by said waterproof cover in a waterproof manner and is pressed by said lever body, wherein said lever point is pressed on said elastic accelerating member.

3. The waterproof passive wireless controller, as recited in claim 2, wherein said housing comprises a bottom cover and a top cover coupled to said bottom cover to sandwich said water assembly, wherein said bottom cover comprises a lever stopper coupled at said lever as a pivot point for enabling a pivotal movement of said lever.

* * * * *